United States Patent
Sakashita

(10) Patent No.: US 9,370,807 B2
(45) Date of Patent: Jun. 21, 2016

(54) SUBSTRATE CASE CLEANING APPARATUS

(71) Applicant: HUGLE ELECTRONICS INC., Tokyo (JP)

(72) Inventor: Toshiya Sakashita, Tokyo (JP)

(73) Assignee: HUGLE ELECTRONICS INC., Tokyo (JP)

(*) Notice: Subject to any disclaimer, the term of this patent is extended or adjusted under 35 U.S.C. 154(b) by 0 days.

(21) Appl. No.: 14/420,046

(22) PCT Filed: Sep. 13, 2013

(86) PCT No.: PCT/JP2013/074843
§ 371 (c)(1),
(2) Date: Feb. 6, 2015

(87) PCT Pub. No.: WO2014/046043
PCT Pub. Date: Mar. 27, 2014

(65) Prior Publication Data
US 2015/0217345 A1    Aug. 6, 2015

(30) Foreign Application Priority Data

Sep. 20, 2012 (JP) .................................. 2012-207051

(51) Int. Cl.
*B08B 3/02* (2006.01)
*B08B 3/04* (2006.01)
(Continued)

(52) U.S. Cl.
CPC . *B08B 9/205* (2013.01); *B08B 3/02* (2013.01); *B08B 3/04* (2013.01); *B08B 3/08* (2013.01);
(Continued)

(58) Field of Classification Search
CPC .............. B08B 3/02; B08B 3/04; B08B 3/08; B08B 9/0861; H01L 21/02041; H01L 21/304; H01L 21/67051; H01L 21/67057; H01L 21/67173; H01L 21/67703; H01L 21/6773
USPC .......... 134/56 R, 57 R, 61, 71, 73, 76, 78, 79, 134/80, 133, 134, 137, 157, 158, 902
See application file for complete search history.

(56) References Cited

U.S. PATENT DOCUMENTS

| 6,001,191 A * | 12/1999 | Kamikawa ................ B08B 3/04 134/2 |
| 2005/0072358 A1* | 4/2005 | Katsuoka ............ C23C 18/1628 118/719 |
| 2007/0125404 A1 | 6/2007 | Davis |

FOREIGN PATENT DOCUMENTS

| JP | H11-340311 | 12/1999 |
| JP | 2003-124176 A1 | 4/2003 |

(Continued)

OTHER PUBLICATIONS

International Search Report for International Application No. PCT/JP2013/074843 dated Dec. 17, 2013.

*Primary Examiner* — Michael Barr
*Assistant Examiner* — Levon J Shahinian
(74) *Attorney, Agent, or Firm* — Kratz, Quintos & Hanson, LLP

(57) ABSTRACT

Movement from a carrying table to a support table can be prevented from becoming complicated and made simpler and positioning on the support table can be easily performed. Provision is made of cleaning tanks 40, 50 which hold and clean parts of a substrate case C inside a booth 10 in a separated state, provision is made of a support table 20 which supports the substrate case C in the booth 10, provision is made of a conveyance mechanism which conveys the parts of the substrate case C between the support table 20 and the cleaning tanks 40, 50, provision is made of a carrying table 13 on which the substrate case C is carried at the outside of an opening 11 of the booth 10, provision is made of a movement mechanism 30 which moves the substrate case C between the carrying table 13 and the support table 20, and the movement mechanism 30 carries the support table 20 and can be moved to the two positions of an advance position R1 where it advances to the carrying table 13 side and receives and delivers a substrate case C with the carrying table 13 and a retraction position R2 where it retracts inside the booth 10 and delivers and receives a substrate case C with the conveyance mechanism.

4 Claims, 24 Drawing Sheets

(51) Int. Cl.
*B08B 3/08* (2006.01)
*B08B 9/08* (2006.01)
*B08B 9/20* (2006.01)
*H01L 21/02* (2006.01)
*H01L 21/304* (2006.01)
*H01L 21/67* (2006.01)
*H01L 21/673* (2006.01)
*H01L 21/677* (2006.01)
*G03F 1/66* (2012.01)

(52) U.S. Cl.
CPC ........ *B08B 9/0861* (2013.01); *H01L 21/02041* (2013.01); *H01L 21/304* (2013.01); *H01L 21/67051* (2013.01); *H01L 21/67057* (2013.01); *H01L 21/6773* (2013.01); *H01L 21/67173* (2013.01); *H01L 21/67353* (2013.01); *H01L 21/67703* (2013.01); *G03F 1/66* (2013.01)

(56) References Cited

FOREIGN PATENT DOCUMENTS

| | | |
|---|---|---|
| JP | 2005-109523 A1 | 4/2005 |
| JP | 2009-523314 A1 | 6/2009 |
| JP | 2010-56450 A1 | 3/2010 |

* cited by examiner

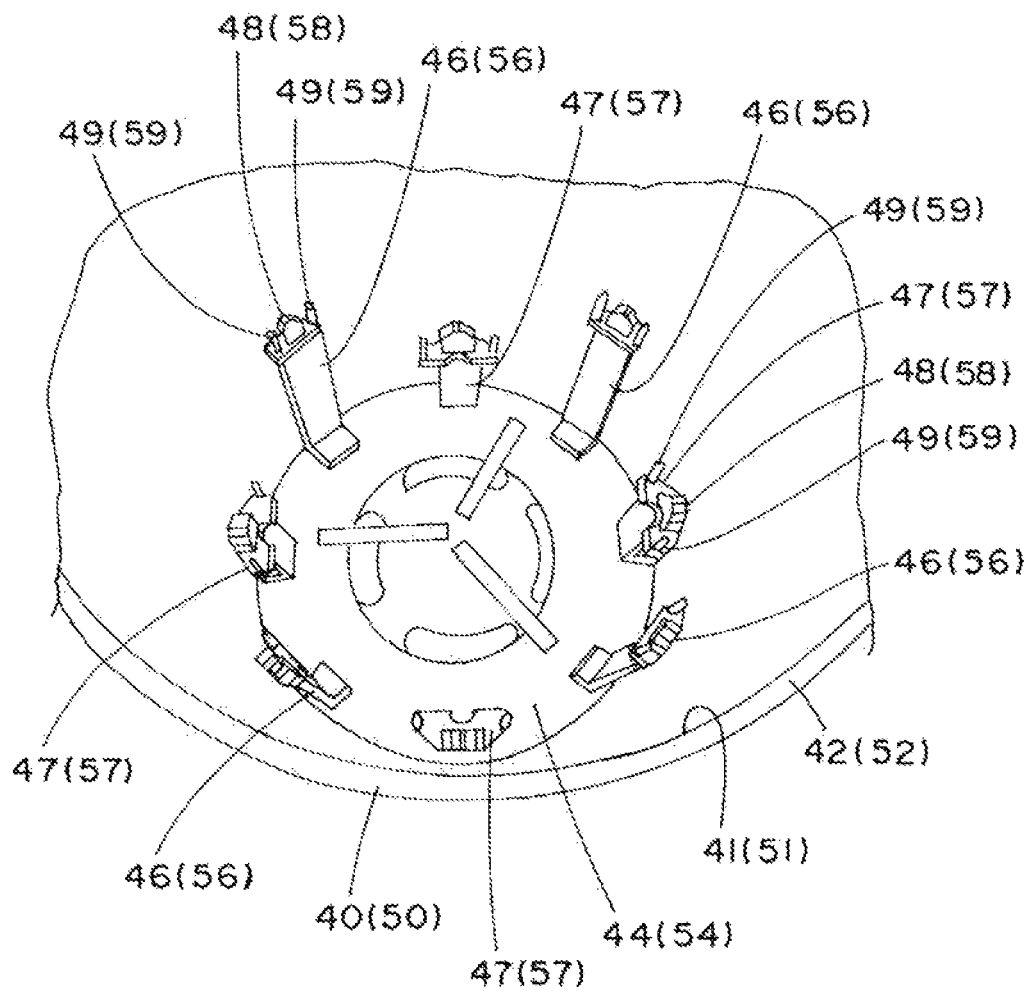

SUBSTRATE CASE CLEANING APPARATUS

TECHNICAL FIELD

The present invention relates to a substrate case cleaning apparatus which cleans a substrate case which is used when storing or transporting a substrate which is used when transferring a circuit pattern of an electronic device such as a mask substrate or wafer or other semiconductor substrate or other substrate.

BACKGROUND ART

In the past, as this type of substrate case cleaning apparatus, for example, the one which is described in PLT 1 (Japanese Patent Publication No. 2005-109523A) was known. As shown in FIG. 22, this substrate case cleaning apparatus Sa cleans a substrate case C, which comprises a base Cb and a shell Cs which covers this base Cb and which holds a substrate (not shown) at its inside, in the state with no substrate. The substrate case cleaning apparatus Sa is provided with a booth 200 which forms a clean space. Inside this booth 200, a cleaning tank 201 is provided which holds and cleans the parts of the base Cb and shell Cs in a separated state. The cleaning tank 201 is provided with a tank body 202 which has an opening which opens to above and a lid 203 which opens and closes the opening of the tank body 202. At the outside of the booth 200, a setting table 204 which carries the substrate case C is provided. An arm robot 205 grips the substrate case C which is carried on the setting table 204 by a gripping hand 207 and conveys it to a support table 206 which is provided at the inside of the booth 200. Further, the arm robot 205 grips the shell Cs of the substrate case C which is supported at the support table 206 by the gripping hand 207 and conveys it to the inside of the tank body 202 of the cleaning tank 201 and conveys the base Cb of the substrate case C to the lid 203 of the cleaning tank 201 to set it there. After that, the lid 203 is closed. In that state, the shell Cs and base Cb are cleaned inside of the tank body 202. When the cleaning ends, the lid 203 of the cleaning tank 201 is opened, and the arm robot 205 successively conveys the base Cb and shell Cs of the substrate case C on the support table 206 where they are assemble into the substrate case C. Further, again, the arm robot 205 conveys the substrate case C from the support table 206 to the setting table 204 outside of the booth 200.

CITATIONS LIST

Patent Literature

PLT 1: Japanese Patent Publication No. 2005-109523A

SUMMARY OF INVENTION

Technical Problem

In this regard, in this conventional substrate case cleaning apparatus Sa, when making the substrate case C move from the setting table 204 to the support table 206 inside the booth 200, it is made to move by the arm robot 205, so the arm of the arm robot 205 has to be made to stick out from the opening of the booth 200 to the outside to the setting table 204. For this reason, the operation becomes complicated and the programming etc. becomes that much more troublesome. Further, the gripping hand 207 of the arm robot 205 raises the substrate case C as a whole, so the positioning on the support table 206 is also troublesome.

The present invention was made in consideration of this situation and provides a substrate case cleaning apparatus which prevents complication and simplifies movement from the setting table to the support table and further enables positioning on the support table to be facilitated.

Solution to Problem

The substrate case cleaning apparatus according to the present invention provides a substrate case cleaning apparatus which cleans, in a state with no substrate, a substrate case which is provided with a base and a shell which covers the base and holds a substrate inside it, the substrate case cleaning apparatus comprising: a booth which forms a clean space, a cleaning tank which is provided inside the booth and holds and cleans parts of the base and shell of the substrate case in a separated state, a support table which supports the substrate case inside the booth, and a conveyance mechanism which conveys the parts of the substrate case between the support table and the cleaning tanks, wherein the booth is provided with an opening through which the substrate case can pass and being opened and closed by a shutter, and the substrate case cleaning apparatus further comprising: a setting table which is provided outside the opening of the booth and on which the substrate case can be positioned and placed at a predetermined positron, and a movement mechanism which opens the shutter and moves the substrate case placed on the setting table to the support table before cleaning the substrate case and which opens the shutter and moves the substrate case placed on the support table to the setting table after cleaning the substrate case, wherein the movement mechanism comprises a stand which carries the support table and can move to the two positions of an advance position where it advances to the setting table side and receives and delivers the substrate case between the setting table and support table and a retraction position where it retracts to the inside of the booth and delivers and receives the substrate case with the conveyance mechanism, a rail which supports the stand to be able to move, and an advance/retraction drive part which makes the stand move to the two positions of the advance position and retraction position.

Due to this, before cleaning the substrate case, the shutter of the booth is opened, the advance/retraction drive part of the movement mechanism makes the stand advance together with the support table to the advance position, and the substrate case which is carried on the setting table is received on the support table. From this, the advance/retraction drive part of the movement mechanism makes the stand retract together with the support table to the retraction position and closes the shutter. At this retraction position, the parts of the substrate case on the support table are delivered to the conveyance mechanism. The parts are conveyed by the conveyance mechanism and the parts are cleaned, then the parts are again conveyed by the conveyance mechanism to the retraction position where the parts of the substrate case are received on the support table. In this state, the shutter of the booth is opened, the advance/retraction drive part of the movement mechanism makes the stand advance together with the support table to the advance position, and the substrate case on the support table is delivered to the setting table. After that, for example, the stand is made to move to an initial position in the booth where it is made to stand by. In this case, the support table itself is made to directly move so the support table receives and delivers the substrate case, so compared with using an arm robot to make it move like in the past, the substrate case as a whole does not have to be gripped, movement from the setting table to the support table is prevented from becoming complicated and is simplified, and further positioning on the support table can be facilitated.

Further, the substrate case cleaning apparatus according to the present invention, in accordance with need, can be configured so that an engagement recess is formed at a side of the substrate case which is supported by the support table and an engagement projection which engages with the engagement recess of the substrate case is provided at the support table, the setting table is formed into a fork shape which has an opening part which opens toward the booth side and which exposes the engagement recess of the substrate case, and the support table is provided to be able to move up and down with respect to the stand of the movement mechanism, the substrate case cleaning apparatus further comprising an up-down drive part which makes the support table move up and down, and wherein at the advance position, the support table is made to rise so as to make the engagement projection of the support table engage with the engagement recess of the substrate case and raise the substrate case and can move the support table through the opening part of the setting table while lifting up the substrate case.

Due to this, before cleaning the substrate case, at the advance position of the stand, the up-down drive part is made to raise the support table and the engagement projection of the support table is made to engage with the engagement recess of the substrate case and lift up the substrate case. Next, the stand is made to retract together with the support table to the retraction position, but the setting table is formed into a fork shape which has an opening part, so the support table moves through the opening part of the setting table while lifting up the substrate case and is positioned at the retraction position. In this case, the support table itself directly receives the substrate case, so the substrate case can be reliably moved. Further, the substrate case which is carried positioned at a predetermined position of the setting table can be supported positioned at a predetermined position on the support table due to engagement of the engagement recess, and the engagement projection and the positioning precision can be improved.

Further, after cleaning the substrate case, if the substrate case is received by the support table at the retraction position, the stand is made to advance together with the support table to the advance position, but the setting table is formed into a fork shape which has the opening part, so the support table moves through the opening part of the setting table while lifting up the substrate case and is positioned at the advance position. At this advance position, the up-down drive part makes the support table descend, separates the engagement projection of the support table from the engagement recess of the substrate case, and places the substrate case on the setting table. In this case, the support table itself directly receives and delivers the substrate case, so the substrate case can be reliably moved.

Furthermore, the substrate case cleaning apparatus according to the present invention may, in accordance with need, have the support table provided with a suction disk which holds by suction the substrate case at a side which is supported by said support table. Since the parts of the substrate case at the side supported by the support table are held by suction by the suction disk, the substrate case is prevented from moving to the left or right or to the front or back and the conveyance mechanism can reliably deliver and receive the parts.

Furthermore, the substrate case cleaning apparatus according to the present invention, in accordance with need, can be configured so that a latch type lock part which locks the parts of the substrate case to be unable to separate from each other and which unlocks them to enable separation is provided at the substrate case at the side which is supported by the support table, and a latch drive part which locks and unlocks said lock part when making said support table rise and making the engagement projection of said support table engage with the engagement recess of the substrate case at the advance position is provided at the support table. Since the latch drive part can lock and unlock the lock part, the part of the substrate case can be reliably separated and assembled.

Advantageous Effects of Invention

According to the substrate case cleaning apparatus of the present invention, the support table itself is directly made to move and the support table receives and delivers the substrate case, so compared with using an arm robot for movement like in the past, the substrate case as a whole no longer has to be gripped, movement from the setting table to the support table is prevented from becoming complicated and is simplified and, further, positioning on the support table can also be easily performed.

BRIEF DESCRIPTION OF DRAWINGS

FIG. 9 is a perspective view which shows an internal configuration of a first cleaning tank (a second cleaning tank) of a substrate case cleaning apparatus according to an embodiment of the present invention.

DETAILED DESCRIPTION OF EMBODIMENT

Below, based on the attached drawings, a substrate case cleaning apparatus according to an embodiment of the present invention will be explained in detail. A substrate case cleaning apparatus S according to an embodiment of the present invention which is shown in FIG. 1 to FIG. 19 is one which handles a substrate case C which holds an EUV mask as the substrate D which is shown in FIG. 20A and FIG. 20B. In recent years, for example, in photolithography drawing integrated circuit patterns on a silicon wafer, along with the higher integration of LSIs, an EUV (Extreme Ultra Violet) mask has been used as the substrate on which EUV light is irradiated in a vacuum. The substrate case C holds and stores this EUV mask and is a double-layer structure. This double-layer structure substrate case C is provided with an inner pod N and an outer pod M. The inner pod N is comprised of an inner base Nb and an inner shell Ns which covers this inner base Nb and holds a mask as a substrate D inside it. The outer pod M is comprised of an outer base Mb which supports the inner base Nb of the inner pod N and an outer shell Ms which covers the outer base Mb. The substrate case C is made a double-layer structure in this way so as to thoroughly protect the substrate D from being contaminated from the outside air. The outer pod M is exposed to the outside air, but the inner pod N is never intentionally exposed to the outside air so long as the outer pod M is not opened. The substrate case cleaning apparatus S cleans the substrate case C in a state with no substrate D.

Figure 21:
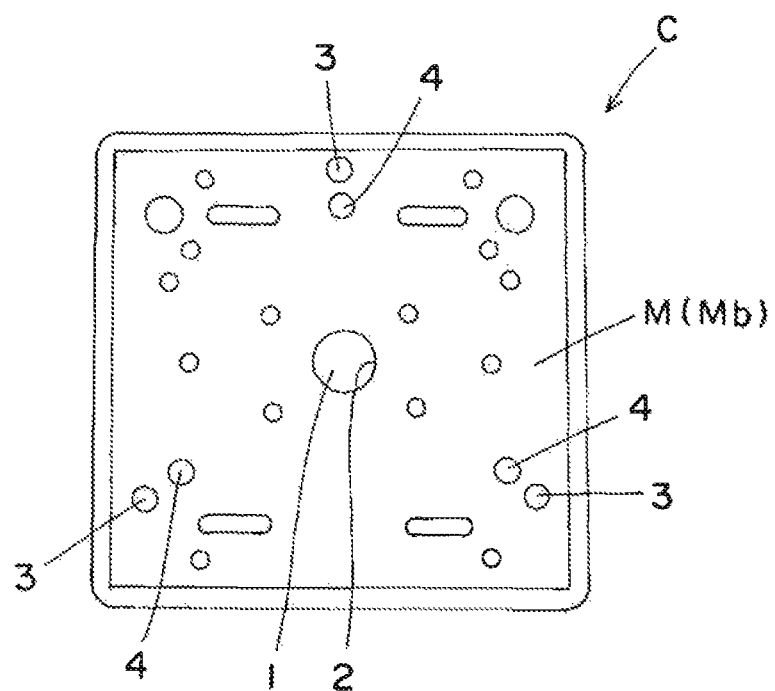
FIG. 21 is a view which snows an outside surface of an outer base handled by a substrate case cleaning apparatus according to an embodiment of the present invention.
Figure 22:
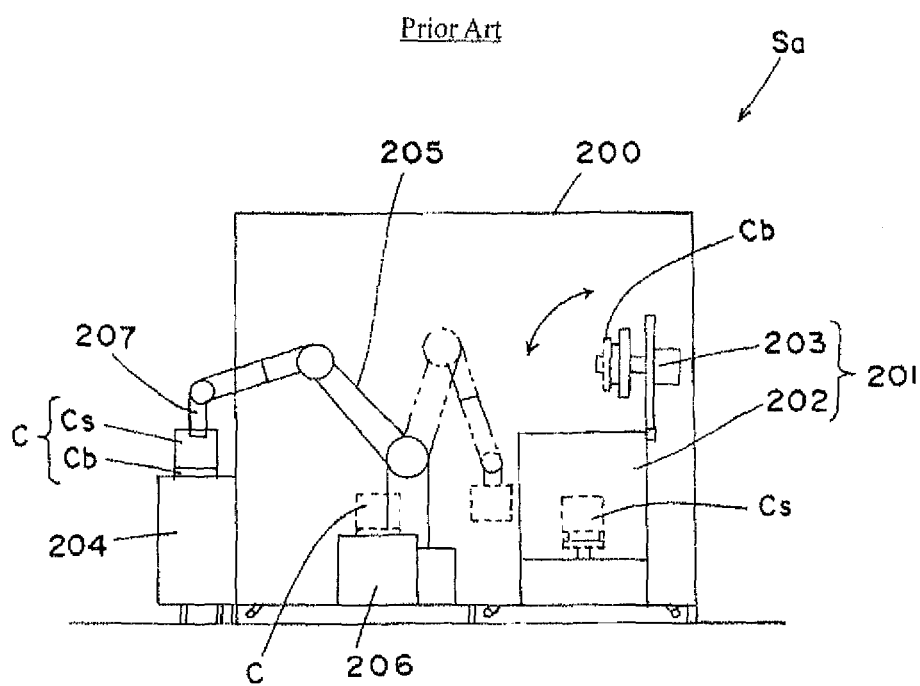
FIG. 22 is a view which shows an example of a conventional substrate case cleaning apparatus.

As shown in FIG. 21, at the center of the outer base Mb of the outer pod M, a latch type lock part 1 is provided which can lock the parts of the outer base Mb and outer shell Ms of the outer pod M and the inner base Nb and inner shell Ns of the inner pod N to be unable to separate from each other and which can unlock them to enable separation. The lock part 1 has an insertion hole 2 which is formed at the outside surface of the outer base Mb and is provided with a mechanism (not shown) at the inside of this insertion hole 2. A latch pin 21a of a latch drive part 21 which is provided at a later explained support table 20 is inserted from this insertion hole 2. The latch drive part 21 can be turned to lock or unlock the lock part 1. Further, positioning recesses 3 in which positioning pins 15 which are provided at a later explained setting table 13 are inserted are provided in an equiangular relationship at three locations. Furthermore, engagement recesses 4 where engagement projections 23 of the later explained support table 20 and engagement projections 91 for positioning use which are provided at a back surface of a lid 43 of the first cleaning apparatus 40 are provided in an equiangular relationship at three locations adjoining the outsides of the positioning recesses 3.

The substrate case cleaning apparatus S according to an embodiment of the present invention, as shown in FIG. 1 to FIG. 4, is provided with a booth 10 which forms a clean space. The booth 10 is provided with an opening 11 through which a substrate case C can pass and which is opened and closed by a shutter 12. The shutter 12 is made to open and close by an actuator 12a. At the outside of the opening 11 of the booth 10, a setting table 13 on which the substrate case C can be positioned and set at a predetermined orientation at a predetermined position is provided. The setting table 13 supports the substrate case C with the outer base Mb facing down. As shown in FIG. 5, it is formed into a fork shape which has an opening part 14 which opens toward the booth 10 side and exposes the engagement recesses 4 of the outer base Mb of the substrate case C. At the top surface of the setting table 13, three positioning pins 15 which are inserted into three positioning recesses 3 which are provided at the back surface of the outer base Mb are provided for positioning. Further, on the top surface of the setting table 13, four positioning blocks 16 for positioning use which hold the corner parts of the outer base Mb are provided.

Figure 6A:
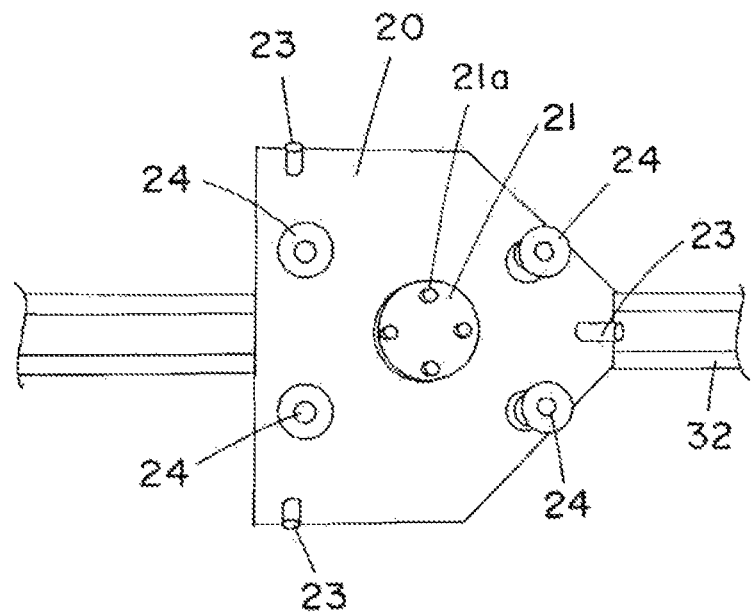
FIG. 6A is a perspective view which shows a support table of a substrate case cleaning apparatus according to an embodiment of the present invention.

Further, the substrate case cleaning apparatus S, as shown in FIG. 1, FIG. 2, and FIG. 6A to FIG. 8E, is provided with a support table 20 which supports a substrate case C inside the booth 10 with the outer base Mb facing down in a state assembled to be able to be separated in the vertical direction. The support table 20 is provided at a movement mechanism 30. Specifically, as shown in FIG. 6A, at the center of the support table 20, a latch drive part 21 is provided which is inserted from the insertion hole 2 of the outer base Mb of the supported substrate case C and can lock and unlock the lock part 1. The latch drive part 21 is comprised of a rotatable disk which is provided with a plurality of latch pins 21a. An actuator 22 is provided which can rotate the disk of the latch drive part 21. Furthermore, at the outer periphery of the support table 20, three engagement projections 23 are provided which engage with the three engagement recesses 4 of the outer base Mb of the supported substrate case C. Furthermore, the support table 20 is provided with four air suction type suction disks 24 which hold by suction the outer base Mb of the supported substrate case C.

Further, as shown in FIG. 1, FIG. 2, and FIG. 7 to FIG. 8E, a movement mechanism 30 which the support table 20 is provided with opens the shutter 12 and moves the substrate case C which is placed on the setting table 13 to the support table 20 before cleaning the substrate case C and opens the shutter 12 and moves the substrate case C which is supported at the support table 20 to the setting table 13 after cleaning the substrate case C. This movement mechanism 30 is provided with a stand 31 which carries the support table 20. The stand 31 can move between two positions of an advance position R1 where it advances to the setting table 13 side to receive and deliver a substrate case C between the setting table 13 and the support table 20 and a retraction position R2 where it retracts inside the booth 10 to deliver and receive a substrate case C with the later explained conveyance mechanism. Further, the stand 31 can also be positioned at an initial position R3 further retracted from the retraction position R2. The movement mechanism 30 is provided with a rail 32 which supports this moving stand 31 to be able to move and an advance/retraction drive part 33 which is provided with for example a ball screw mechanism which makes the stand 31 move to the two positrons of the advance position R1 and retraction position R2 and to the initial position R3.

Figure 8A:
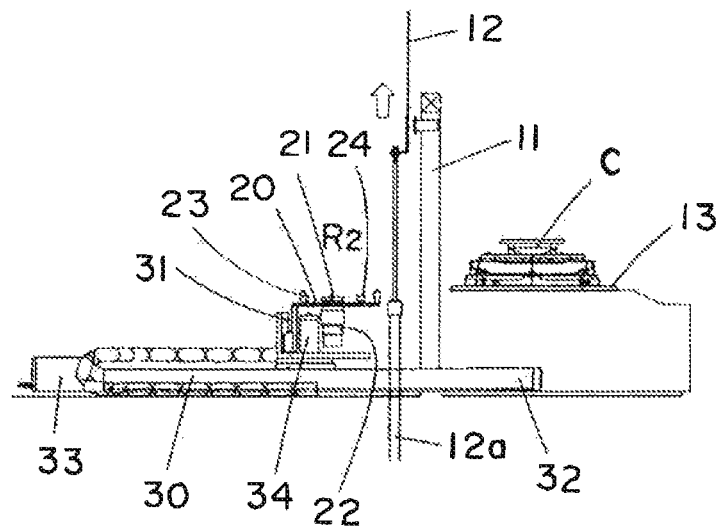
FIG. 8A is a process chart which shows a movement mechanism of a substrate case cleaning apparatus according to an embodiment of the present invention together with its operation (part 1).
Figure 8B:
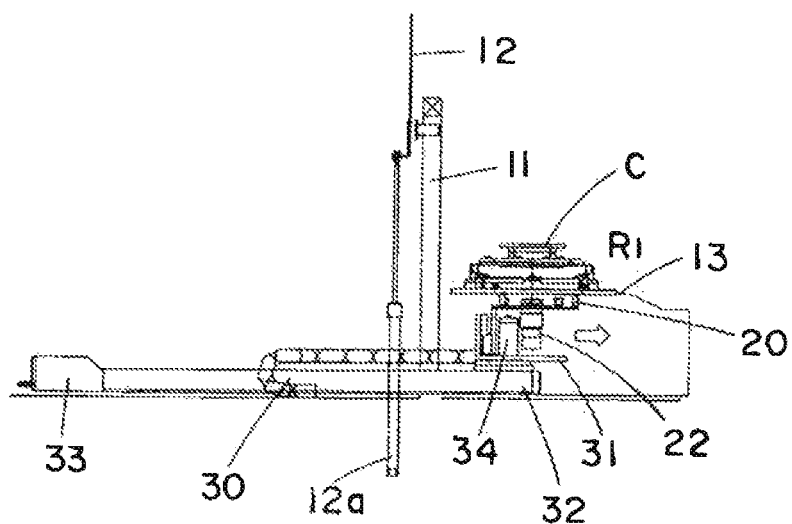
FIG. 8B is a process chart which shows a movement mechanism of a substrate case cleaning apparatus according to an embodiment of the present invention together with its operation (part 2).
Figure 8C:
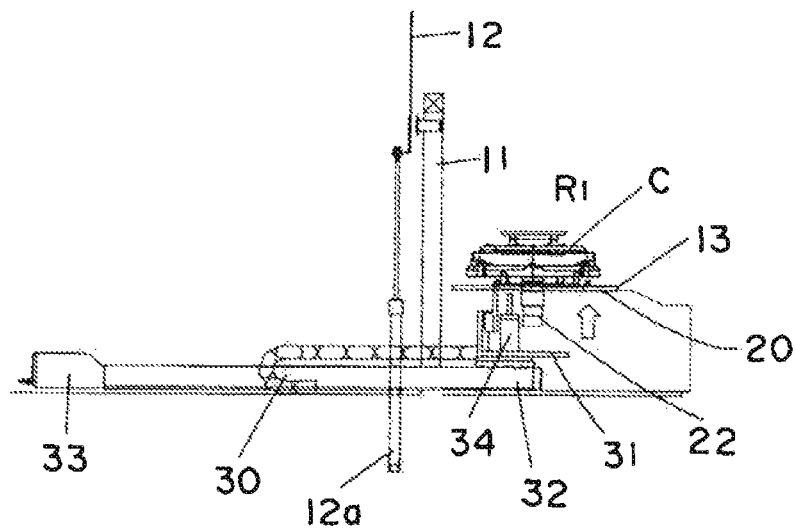
FIG. 8C is a process chart which shows a movement mechanism of a substrate case cleaning apparatus according to an embodiment of the present invention together with its operation (part 3).

The support table 20, as shown in FIG. 8B and FIG. 8C, is provided to be able to move up and down with respect to the stand 31 of the movement mechanism 30. The stand 31 is provided with an up-down drive part 34 which is comprised of an air cylinder apparatus which makes the support table 20 move up and down. The movement mechanism 30 makes the support table 20 rise at the advance position R1 to thereby make the engagement projections 23 of the support table 20 engage with the engagement recesses 4 of the substrate case C and hold the substrate case C by suction by the suction disks 24 and lift up the substrate case C. Further, the movement mechanism 30 can move the support table 20 through the opening 14 of the setting table 13 while lifting up the substrate case C. Further, the latch drive part 21 which is provided at the support table 20 locks and unlocks the lock part 1 when making the support table 20 rise at the advance position R1 of the stand 31 to make the engagement projections 23 of the support table 20 engage with the engagement recesses 4 of the substrate case C.

Furthermore, as shown in FIG. 1 to FIG. 3 and FIG. 9 to FIG. 15B, inside the booth 10, a first cleaning tank 40 which holds and cleans the parts of the outer base Mb and outer shell Ms of the outer pod M in the separated state and a second cleaning tank 50 which holds and cleans the parts of the inner base Nb and inner shell Ns of the inner pod N in the separated state are provided. The support table 20, the first cleaning tank 40, and the second cleaning tank 50 are arranged in series along one horizontal direction (Y-axis direction). Further, inside the booth 10, a conveyance mechanism 6 which conveys the parts of the outer pod M and the inner pod N of the substrate case C between the support table 20 and the corresponding first cleaning tank 40 and second cleaning tank 50 is provided.

In more detail, the first cleaning tank 40 is provided with a tank body 42 which has an opening 41 which opens upward and a lid 43 which can open and close to open the opening 41 of the tank body 42 when conveying the parts of the outer pod M of the substrate case C and close it when cleaning the parts. Further, as shown in FIG. 9, the first cleaning tank 40 is provided with a first rotating plate 44 which is provided at the bottom part of the tank body 42 to be able to rotate about the vertical direction axis, a first rotation drive part 45 which drives rotation of the first rotating plate 44, a plurality of (four) outer base support rods 46 which are provided standing up at the first rotating plate 44 and support parts of the outer edge of the outer base Mb (in the embodiment, the four corner parts) at a predetermined height position, and a plurality of (four) outer shell support rods 47 which are provided standing up at the first rotating plate 44 and support parts of the outer edge of the outer shell Ms (in the embodiment, the four corner parts) at a predetermined height position different from the outer base support rods 46.

The outer base support rods 46 are set higher than the outer shell support rods 47 and support the outer base Mb at a position higher than the outer shell Ms. As shown in FIG. 9, the front end parts of the outer base support rods 46 and the outer shell support rods 47 are provided with support members 48 which support the corner parts of the parts and with guide pins 49 which are provided at the lefts and rights of the support members 48 and guide the two sides of the corners of the parts. Further, the plurality of outer base support rods 46 and the plurality of outer shell support rods 47 of the first cleaning tank 40 are provided standing up at mutually different positions in the rotational direction. In the embodiment, as shown in FIG. 9 to FIG. 15B, the plurality of outer base support rods 46 and the plurality of outer shell support rods 47 are provided standing up offset in phase 45° in the rotation direction.

On the other hand, the second cleaning tank 50 is provided with a tank body 52 which has an opening 51 which opens upward and a lid 53 which can open and close to open the opening 51 of the tank body 52 when conveying the parts of the inner pod N of the substrate case C and close it when cleaning the parts. In FIG. 9, while the inside of the first cleaning tank 40 is shown, in the second cleaning tank 50 as well, the configuration is common with the first cleaning tank 40. For the corresponding parts, the reference numerals of the second cleaning tank 50 are provided in parentheses. As shown in FIG. 9, the second cleaning tank 50 is provided with a second rotating plate 54 which is provided at the bottom part of the tank body 52 to be able to rotate about the vertical direction axis, a second rotation drive part 55 which drives rotation of the second rotating plate 54, a plurality of (four) inner base support rods 56 which are provided standing up at the second rotating plate 54 and support parts of the outer edge of the inner base Nb (in the embodiment, the four corner parts) at a predetermined height position, and a plurality of (four) inner shell support rods 57 which are provided standing up at the second rotating plate 54 and support parts of the outer edge of the inner shell Ns (in the embodiment, the four corner parts) at a predetermined height position different from the inner base support rods 56.

The inner base support rods 56 are set higher than the inner shell support rods 57 and support the inner base Nb at a higher position than the inner shell Ns. As shown in FIG. 9, the front end parts of the inner base support rods 56 and inner shell support rods 57 are provided with support members 58 which support the corner parts of the parts and with guide pins 59 which are provided at the lefts and rights of the support members 58 and guide the two sides of the corners of the parts. Further, the plurality of inner base support rods 56 and the plurality of inner shell support rods 57 of the second cleaning tank 50 are provided standing up at mutually different positions in the rotational direction. In the embodiment, as shown in FIG. 9 to FIG. 15B, the plurality of inner base support rods 56 and the plurality of inner shell support rods are provided standing up offset in phase 45° in the rotation direction. Further, inside the first cleaning tank 40 and the second cleaning tank 50, a group of cleaning solution nozzles which eject a known cleaning solution and an air nozzle which ejects dry air for drying are provided.

Figure 4:
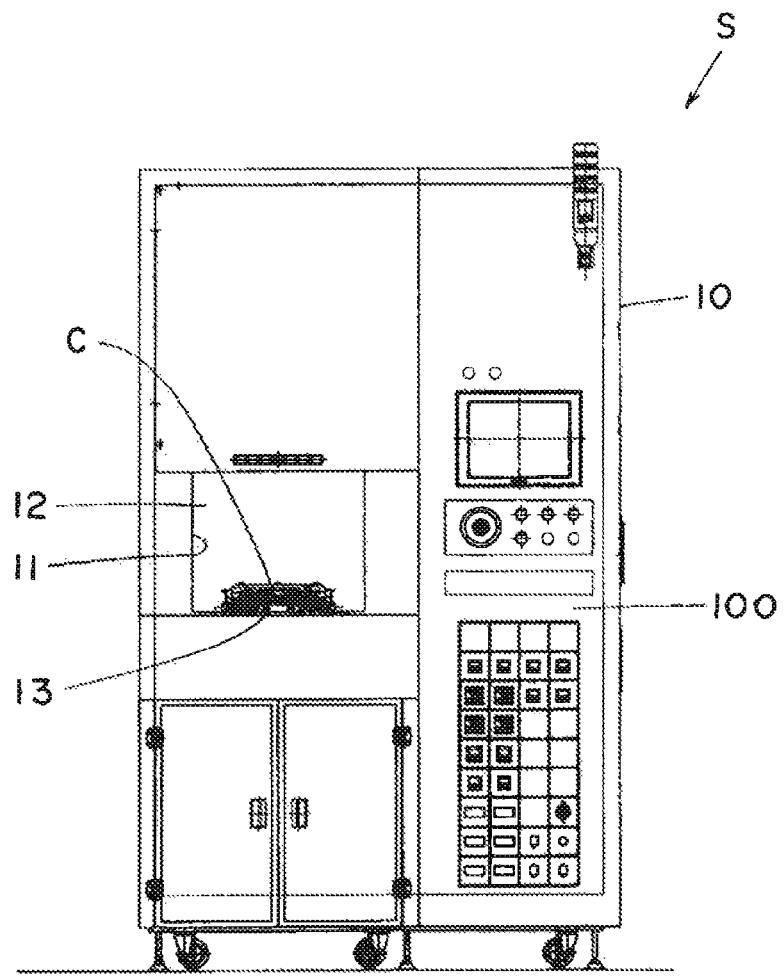
FIG. 4 is a front view which shows a substrate case cleaning apparatus according to an embodiment of the present invention.
Figure 5:
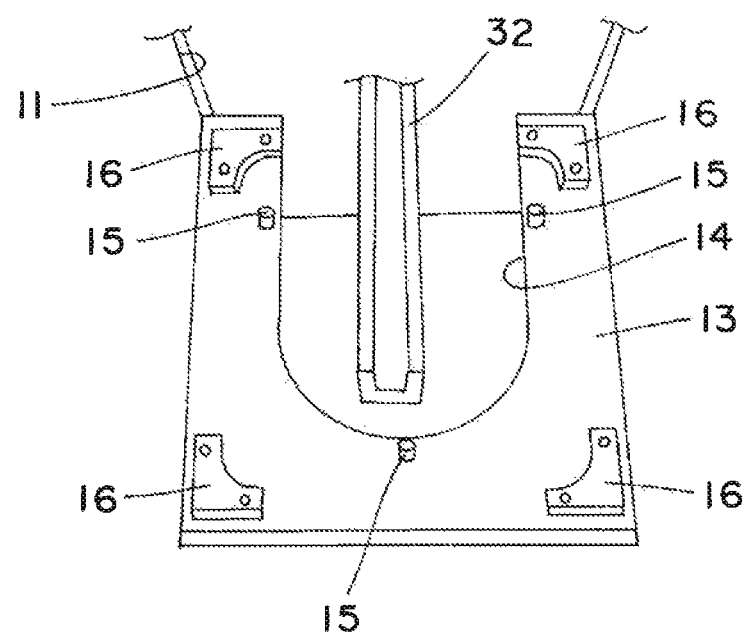
FIG. 5 is a perspective view which shows a setting table of a substrate case cleaning apparatus according to an embodiment of the present invention.
Figure 10A:
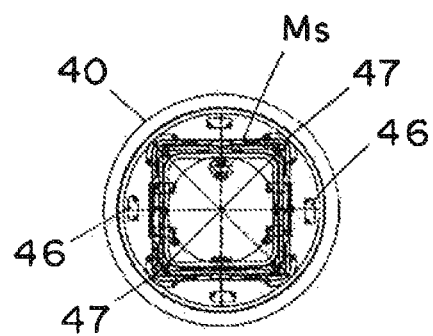
FIG. 10A is a plan view which shows the state of supporting an outer shell of a first cleaning tank in a substrate case cleaning apparatus according to an embodiment of the present invention.
Figure 11A:
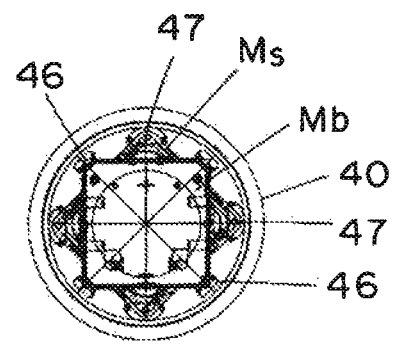
FIG. 11A is a plan view which shows the state of supporting an outer base of a first cleaning tank in a substrate case cleaning apparatus according to an embodiment of the present invention.
Figure 12A:
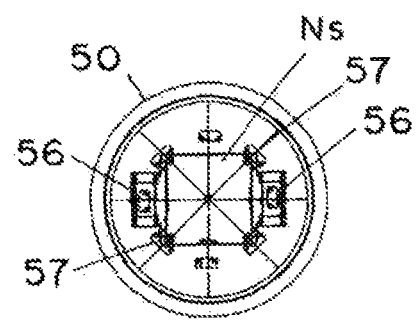
FIG. 12A is a plan view which shows the state of supporting an inner shell of a second cleaning tank in a substrate case cleaning apparatus according to an embodiment of the present invention.
Figure 13A:
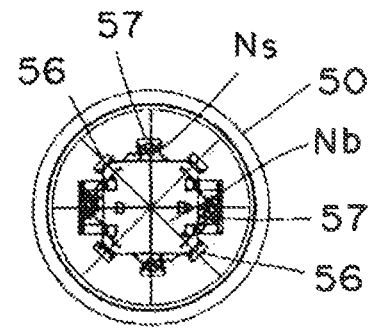
FIG. 13A is a plan view which shows the state of supporting an inner base of a second cleaning tank in a substrate case cleaning apparatus according to an embodiment of the present invention.
Figure 13B:
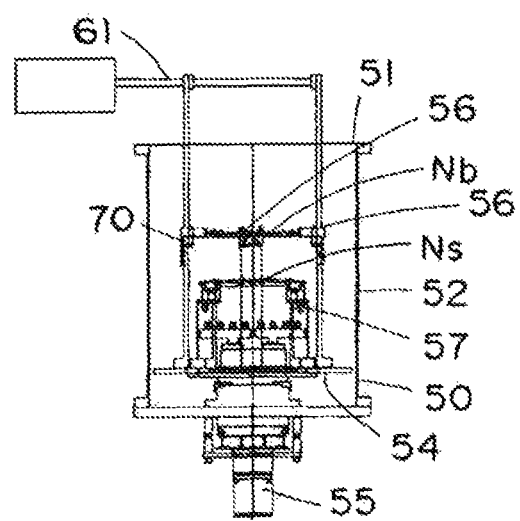
FIG. 13B is a side cross-sectional view which shows the state of supporting an inner base of a second cleaning tank in a substrate case cleaning apparatus according to an embodiment of the present invention.

Further, the present apparatus, as shown in FIG. 4, is provided with a later explained control part 100. The control part 100 is provided with the function of controlling the first rotation drive part 45 and setting the stop position of the outer base support rods 46 when supporting and releasing support of the outer base Mb and the stop position of the outer shell support rods 47 when supporting and releasing support of the outer shell Ms offset in phase. In the embodiment, as shown in FIG. 10A and FIG. 11A, the rods are offset in phase 45° in the rotational direction. This control part 100, in the same way, is provided with the function of controlling the second rotation drive part 55 and setting the stop position of the support rods of the inner base Nb when supporting and releasing support of the inner base Nb and the stop position of the inner shell support rods 57 when supporting and releasing support of the inner shell Ns offset in phase. In the embodiment, as shown in FIG. 12A and FIG. 13A, the rods are offset in phase 45° in the rotational direction.

Further, the support table 20 supports the substrate case C with the outer base Mb facing down at the support table 20, so the conveyance mechanism 60 conveys the outer shell Ms, inner shell Ns, inner base Nb, and outer base Mb in that order from the support table 20 to the insides of the respectively corresponding first cleaning tank 40 and second cleaning tank 50 before cleaning the substrate case C. Further, the conveyance mechanism 60 conveys the outer base Mb, inner base Nb, inner shell Ns, and outer shell Ms in that order from the insides of the corresponding first cleaning tank 40 and second cleaning tank 50 to the support table 20 after cleaning the substrate case C.

In more detail, the conveyance mechanism 60, as shown in FIG. 2, FIG. 3, FIG. 7, and FIG. 10A to FIG. 18B, is provided with a holding mechanism 61 which can respectively grip the outer base Mb and outer shell Ms of the outer pod M and the inner base Nb and inner shell Ns of the inner pod N, an elevation mechanism 62 which can make the holding mechanism 61 ascend and descend in the vertical direction (Z-axis direction), and a running movement mechanism 63 which makes the holding mechanism 61 move running in one horizontal direction (Y-axis direction). The control part 100 controls the drive operation of the holding mechanism 61, the elevation mechanism 62, and the running movement mechanism 63. Due to this, the support table 20, the first cleaning tank 40, and the second cleaning tank 50 are provided in series along one horizontal direction (Y-axis direction). The conveyance mechanism 60 can convey parts by just making the holding mechanism 61 move in the two axial directions of the vertical direction (Z-axis direction) and one horizontal direction (Y-axis direction) under the control of the control part 100. For this reason, the conveyance mechanism 60 can be made simpler in structure compared with a conventional arm robot and can easily separate and convey parts. Further, it need not take up as much space and enables space saving.

Figure 16A:
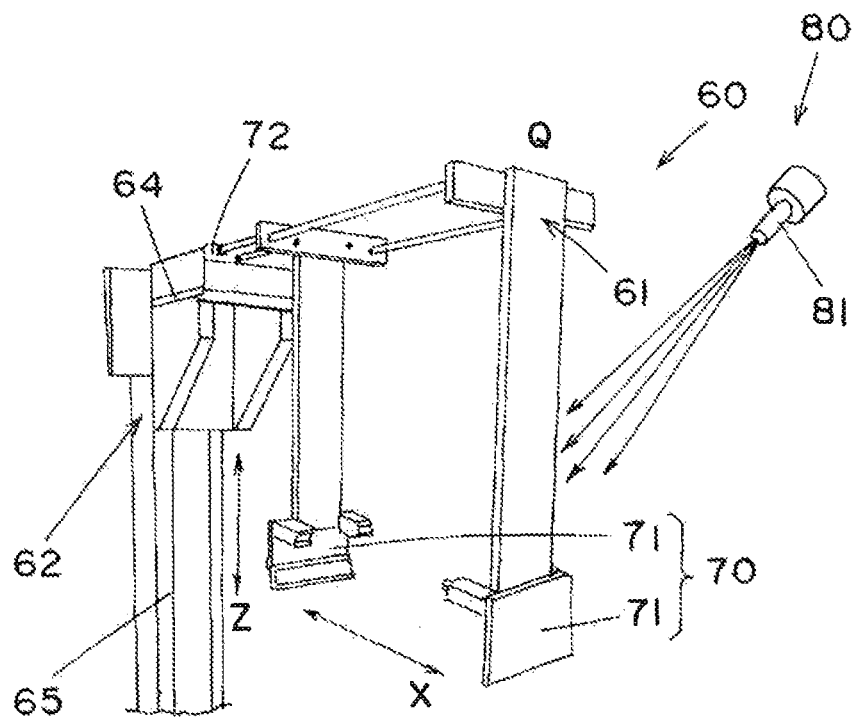
FIG. 16A is a perspective view which shows a holding mechanism and elevation mechanism in a conveyance mechanism in a substrate case cleaning apparatus according to an embodiment of the present invention.
Figure 16B:
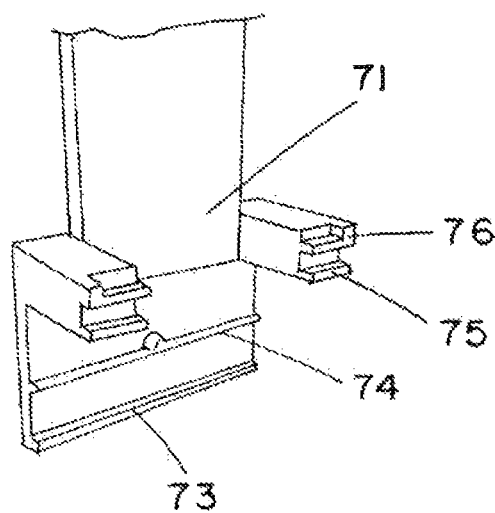
FIG. 16B is a principal perspective view which show main parts of a gripping hand of a holding mechanism in a conveyance mechanism in a substrate case cleaning apparatus according to an embodiment of the present invention.

As shown in FIG. 16A and FIG. 16B, the holding mechanism 61 is provided with a base plate 64. The elevation mechanism 62 is provided with an elevator rail 65 which supports the base plate 64 to be able to ascend and descend. A not shown drive part makes the base plate 64 ascend and descend to position it at a required position in the vertical direction (Z-axis direction). Further, the running movement mechanism 63 is provided with a horizontal rail 67 which supports the elevator rail 65 to be able to move in one horizontal direction (Y-axis direction) and is fastened to the stand 66. The running movement mechanism 63 uses a not shown drive part to make the elevator rail 65 move and position it at a required positron in the one horizontal direction (Y-axis direction).

Figure 3:
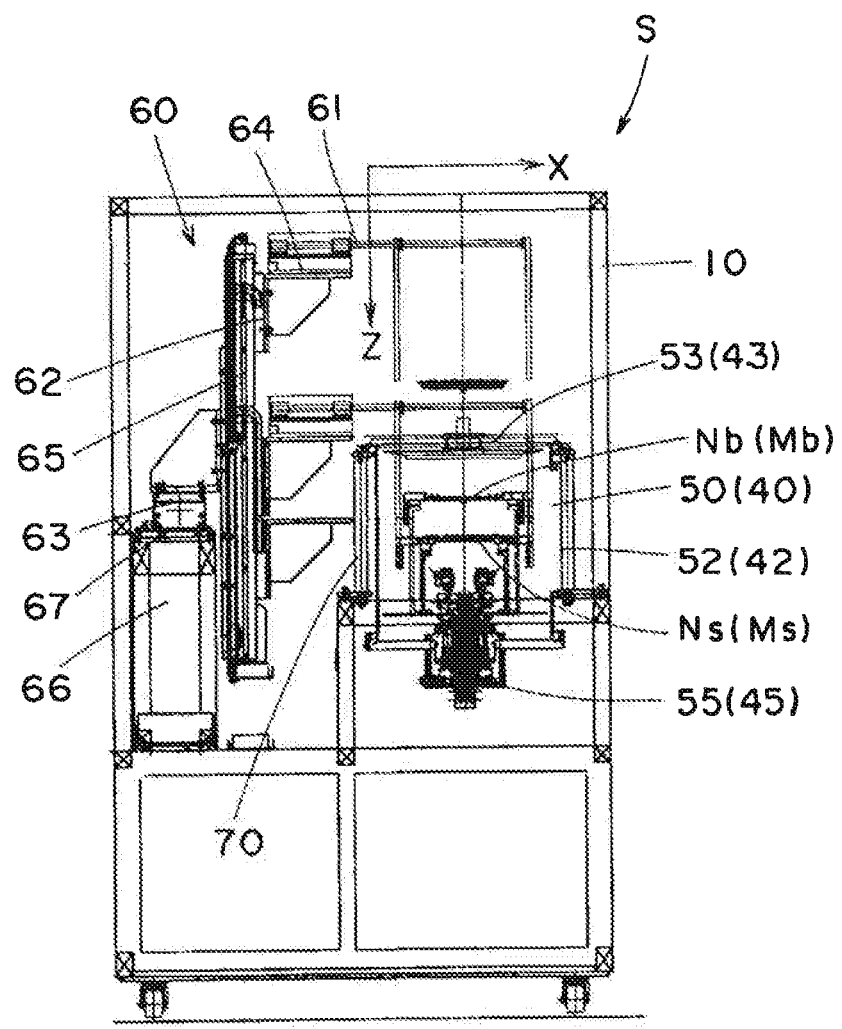
FIG. 3 is a horizontal cross-sectional view which shows a substrate case cleaning apparatus according to an embodiment of the present invention.
Figure 7:
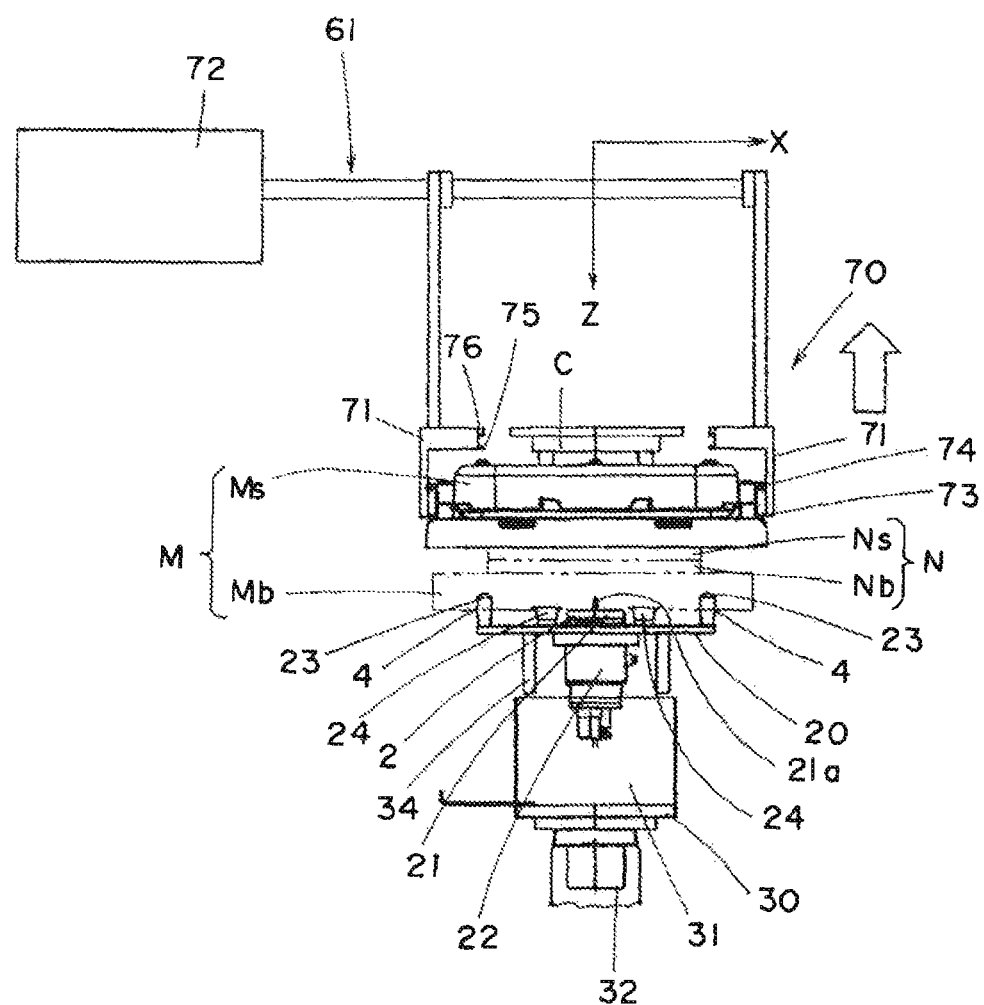
FIG. 7 is a view which shows a support table and holding mechanism of a substrate case cleaning apparatus according to an embodiment of the present invention together with their actions.

The holding mechanism 61, as shown in FIG. 3, FIG. 7, end FIG. 16A to FIG. 18B, is provided with a gripping hand 70 which is provided with a pair of hand units 71, 71 which can approach and move away from each other in the other horizontal direction (X-axis direction) perpendicular to the one horizontal direction (Y-axis direction) and a drive part 72 which makes the pair of hand units 71, 71 of the gripping hand 70 approach and move away from each other. The drive part 72, for example, is comprised of an air cylinder apparatus and is mounted on the base plate 64. The control part 100 controls the pair of hand units 71, 71 of the gripping hand 70 to make them individually grip the outer base Mb and outer shell Ms of the outer pod M and the inner base Nb and inner shell Ns of the inner pod N. The holding mechanism 61 grips the parts under the control of the control part 100 which makes the holding mechanism 61 move in the two axial directions of the one horizontal direction (Y-axis direction) and the vertical direction (Z-axis direction) for positioning and enables the gripping hand 70 to be moved in the other horizontal direction (X-axis direction). Further, the pair of gripping units 71, 71 are used to grip all of the parts, so the structure can be simplified. As shown in FIG. 16B, FIG. 17A, FIG. 17B, FIG. 18A, and FIG. 18B, the pair of hand units 71, 71 of the gripping hand 70 are formed with lock parts 73, 74, 75, and 76 which lock with corresponding shapes of grip parts of the outer base Mb and outer shell Ms of the outer pod M and the inner base Nb and inner shell Ns of the inner pod N.

Figure 1:
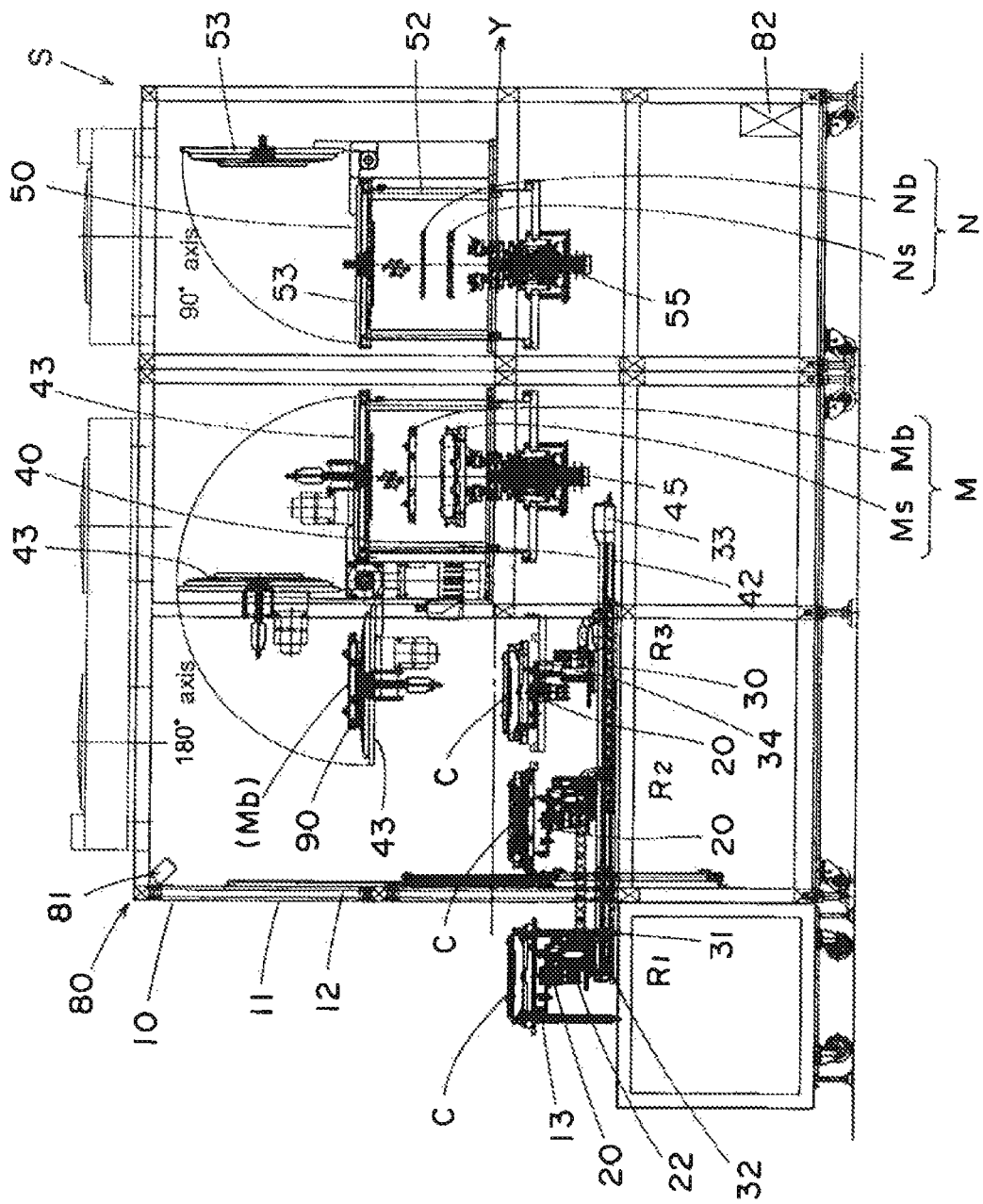
FIG. 1 is a side cross-sectional view which shows a substrate case cleaning apparatus according to an embodiment of the present invention.
Figure 2:
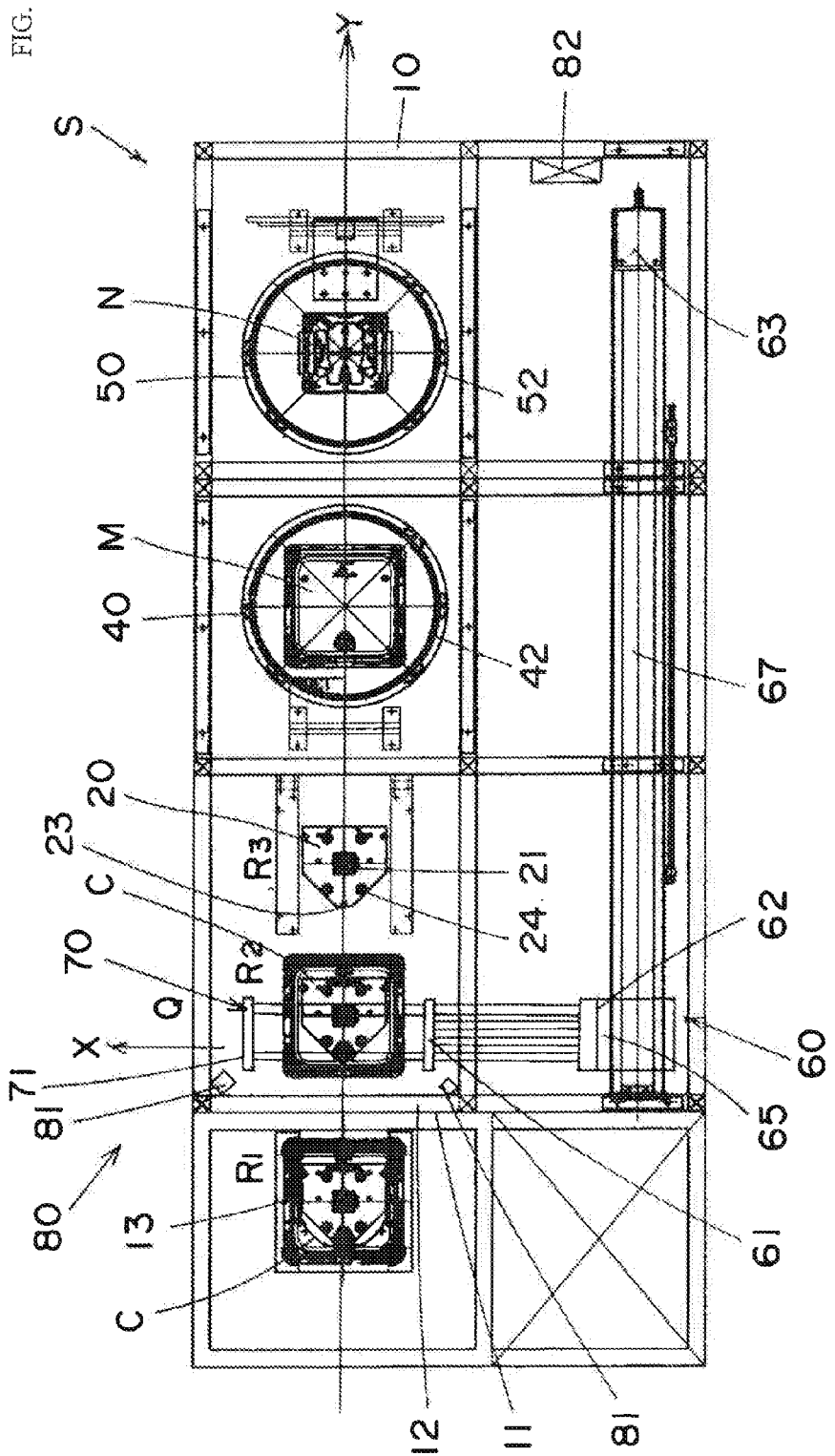
FIG. 2 is a plan cross-sectional view which shows a substrate case cleaning apparatus according to an embodiment of the present invention.

Further, in the substrate case cleaning apparatus S, the control part 100 controls the gripping hand 70 to stand by at the standby position Q (see FIG. 2). In the embodiment, the standby positron Q is set at the side end part of the shatter 12 of the booth 10. Further, as shown in FIG. 1, FIG. 2, and FIG. 16A and FIG. 16B, a cleaning means 80 for cleaning the gripping hand 70 is provided. This cleaning means 80 is provided with a spray nozzle 81 which sprays gas to the gripping hand 70 near the standby position Q and an exhaust fan 82 which exhausts gas which was ejected from the spray nozzle 81 from the inside of the booth 10. As the gas, for example, air, nitrogen gas, etc. may be used.

Figure 19:
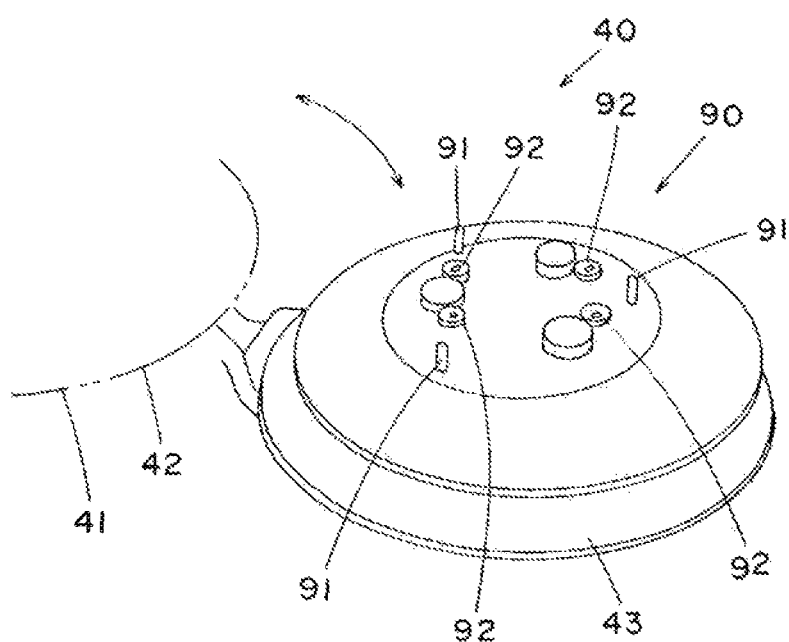
FIG. 19 is a perspective view which shows the configuration of a holding part in a substrate case cleaning apparatus according to an embodiment of the present invention.
Figure 20A:
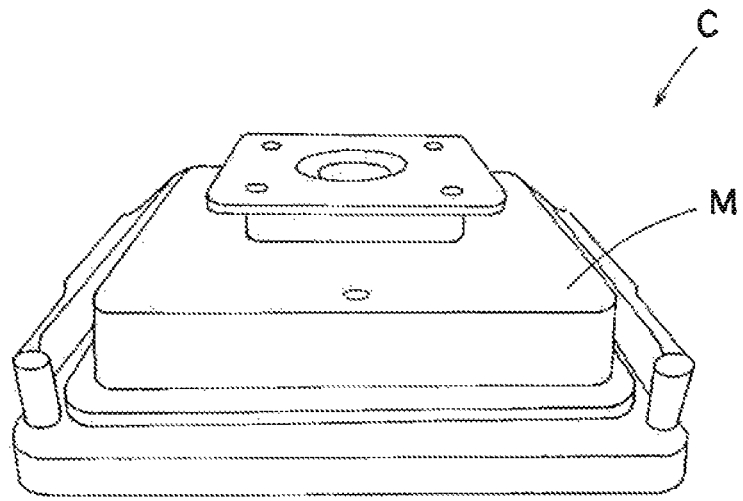
FIG. 20A is an overall perspective view which shows a substrate case handled by a substrate case cleaning apparatus according to an embodiment of the present invention.
Figure 20B:
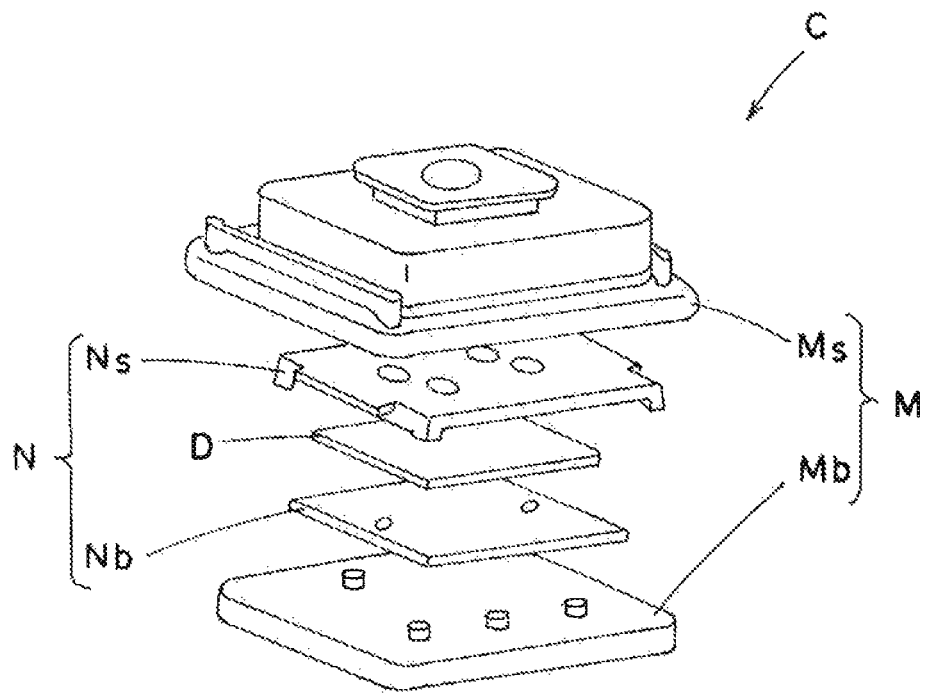
FIG. 20B is a disassembled perspective view which shows a substrate case handled by a substrate case cleaning apparatus according to an embodiment of the present invention.

Furthermore, in the substrate case cleaning apparatus S, as shown in FIG. 1 and FIG. 19, in the first cleaning tank 40, a holding part 90 is provided which can cover and hold the outside surface of a part which does not require cleaning when a part of at least one of the outer base Mb and outer shell Ms of the outer pod M (in the embodiment, the outer base Mb) does not have to be cleaned at the outside surface. The holding part 90 is provided at the back surface of the lid 43 of the first cleaning tank 40 and covers the outside surface of the outer base Mb, as the part not requiring cleaning, by the back surface of the lid 43. The holding part 90 is provided with three engagement projections 91 which engage with three engagement recesses 4 of the outer base MB which is held at the back surface of the lid 43. Further, the holding part 90 is provided with four suction disks 92 which hold the outside surface of the outer base Mb by suction at the back surface of the lid 43. Since the back surface of the lid 43 is utilized, the structure of the holding part 90 can be made simpler.

Further, the control part 100 is provided with the function of judging whether the outside surface of the outer base Mb of the outer pod M does not have to be cleaned and, when judging it does not have to be cleaned, conveying the outer base Mb by the conveyance mechanism 60 to the holding part 90. The control part 100 judges whether cleaning is unnecessary by programming which is performed in advance before cleaning the substrate case C relating to the cleaning or by detection of the model type or shape etc. of the substrate case C by a sensor. In the embodiment, it is performed by programming which is performed in advance before cleaning the substrate case C. Further, the control part 100 performs various control such as control of opening/closing operation of the above-mentioned shutter 12, control of the drive operation of the movement mechanism 30, control of the drive operation of the conveyance mechanism 60, control of the opening/closing operation of the lids 43 and 53 of the first cleaning tank 40 and the second cleaning tank 50, control of rotation of the rotating plates 44, 54, control of cleaning and drying, etc.

Figure 6B:
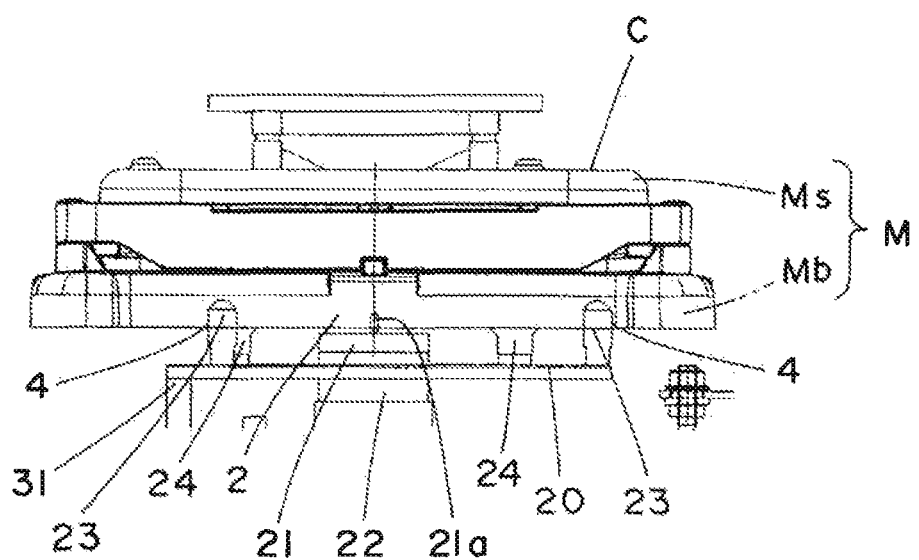
FIG. 6B is a view which shows the state of supporting a substrate case of a support table in a substrate case cleaning apparatus according to an embodiment of the present invention

In the substrate case cleaning apparatus S according to this embodiment, the substrate case C is cleaned in the following way. The control part 100 may be programmed in advance to judge if the outside surface of the outer base Mb of the outer pod M has to be cleaned before cleaning the substrate case C. Here, first, the case where the outside surface of the outer base Mb has to be cleaned will be explained. First, as shown in FIG. 8A, the substrate case C relating to cleaning is set at the setting table 13 by another conveyor etc. Before cleaning the substrate case C, as shown in FIG. 8B, the shutter 12 of the booth 10 is opened, the advance/retraction drive part 33 of the movement mechanism 30 makes the stand 31 advance together with the support table 20 from the initial position R3 to the advance position R1 and the substrate case C which is placed on the setting table 13 is received on the support table 20. At this time, as shown in FIG. 8C and FIG. 6B, at the advance position R1 of the stand 31, the up-down drive part 34 makes the support table 20 rise, makes the engagement projections 23 of the support table 20 engage with the engagement recesses 4 of the outer base Mb of the substrate case C, and lifts up the substrate case C. Further, the outer base Mb is held by suction by the suction disks 24. For this reason, the substrate case C is prevented from moving to the left or right or front or back and is reliably positioned on the support table 20. Furthermore, the latch pin 21a of the latch drive part 21 of the support table 20 is inserted into the insertion hole 2 of the outer base Mb.

Figure 8D:
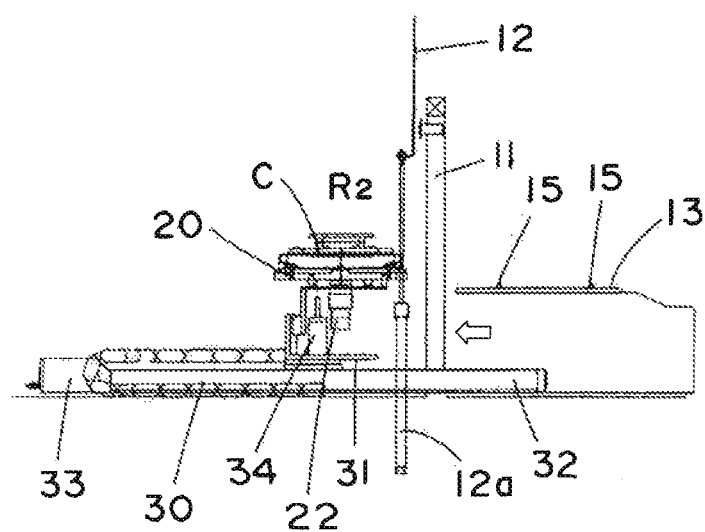
FIG. 8D is a process chart which shows a movement mechanism of a substrate case cleaning apparatus according to an embodiment of the present invention together with its operation (part 4).
Figure 8E:
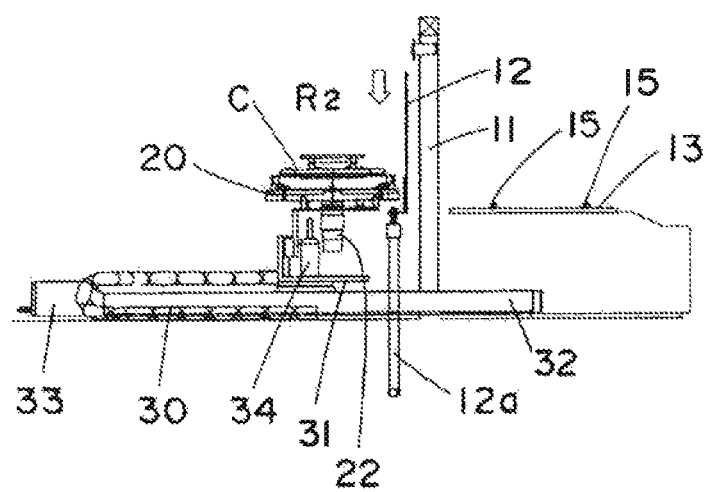
FIG. 8E is a process chart which shows a movement mechanism of a substrate case cleaning apparatus according to an embodiment of the present invention together with its operation (part 5).

Next, as shown in FIG. 8D, the advance/retraction drive part 33 of the movement mechanism 30 makes the stand 31 retract together with the support table 20 from the advance position R1 to the retraction position R2. In this case, since the setting table 13 is formed in a fork shape which has an opening part 14, the support table 20 moves through the opening 14 of the setting table 13 while lifting up the substrate case C and is positioned at the retraction position R2. In this case, the support table 20 itself is made to directly move to make the support table 20 receive the substrate case C, so compared with the case of making it move by an arm robot like in the past, the substrate case as a whole no longer has to be gripped and transfer of the substrate case C from the setting table 13 to the support table 20 is kept from becoming complicated and is simplified. Further, positioning of the substrate case C at the support table 20 also can be facilitated. In particular, it is possible to position and support a substrate case C, which is placed and positioned at a predetermined position of the setting table 13, at a predetermined position on the support table 20 by engagement of the engagement recesses 4 and engagement projections 23 and possible to improve the positioning precision. At this retraction position R2, as shown in FIG. 8E, the latch drive part 21 is driven and unlocked whereby the parts of the outer base Mb and outer shell Ms of the outer pod M and the inner base Kb and inner shell Ms of the inner pod N which are supported at the support table 20 can be detached. Further, the shutter 12 is made to close.

Figure 10B:
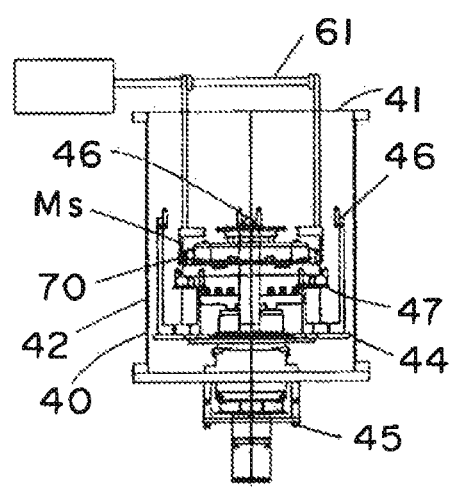
FIG. 10B is a side cross-sectional view which shows the state of supporting an outer shell of a first cleaning tank in a substrate case cleaning apparatus according to an embodiment of the present invention.
Figure 11B:
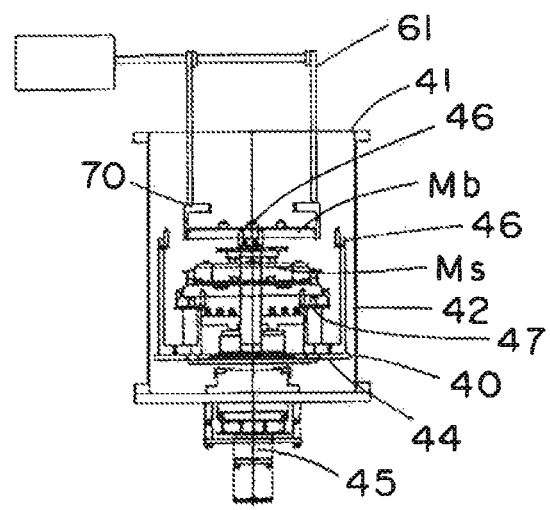
FIG. 11B is a side cross-sectional view which shows the state of supporting an outer base of a first cleaning tank in a substrate case cleaning apparatus according to an embodiment of the present invention.
Figure 12B:
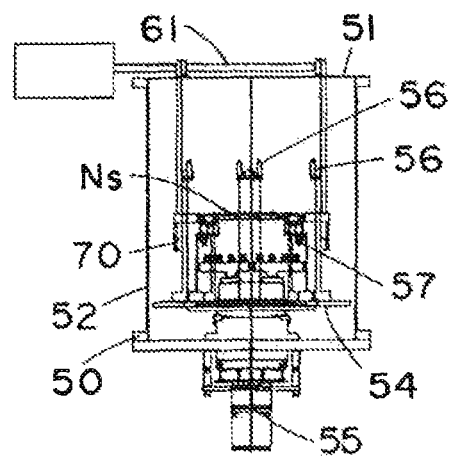
FIG. 12B is a side cross-sectional view which shows the state of supporting an inner shell of a second cleaning tank in a substrate case cleaning apparatus according to an embodiment of the present invention.
Figure 17A:
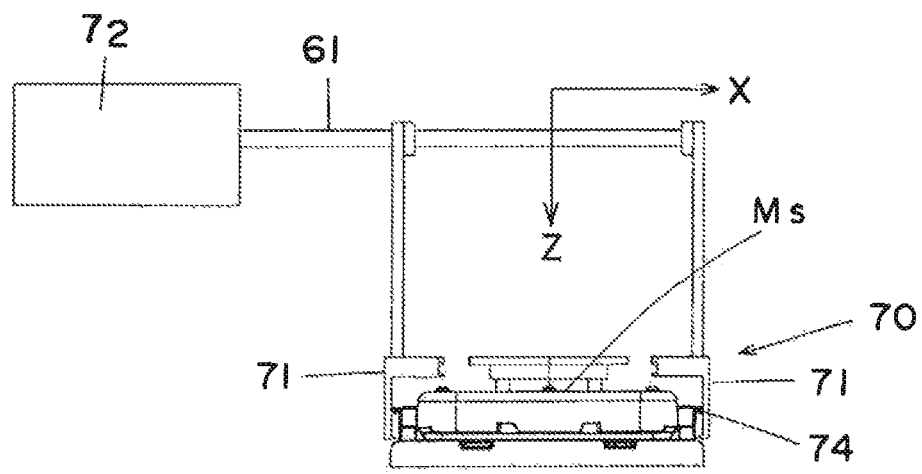
FIG. 17A is a view which shows the state of holding an outer shell of a holding mechanism in a substrate case cleaning apparatus according to an embodiment of the present invention.
Figure 17B:
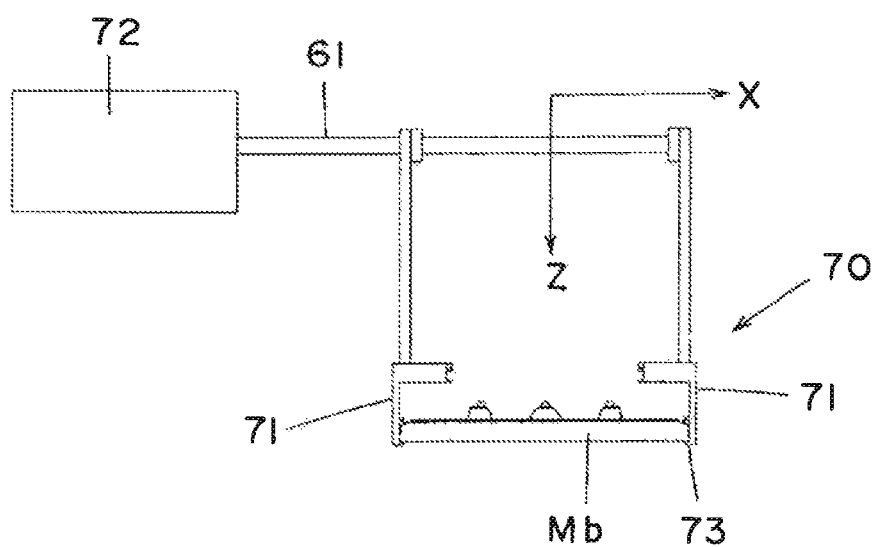
FIG. 17B is a view which shows the state of holding an outer base holding mechanism in a substrate case cleaning apparatus according to an embodiment of the present invention.
Figure 18A:
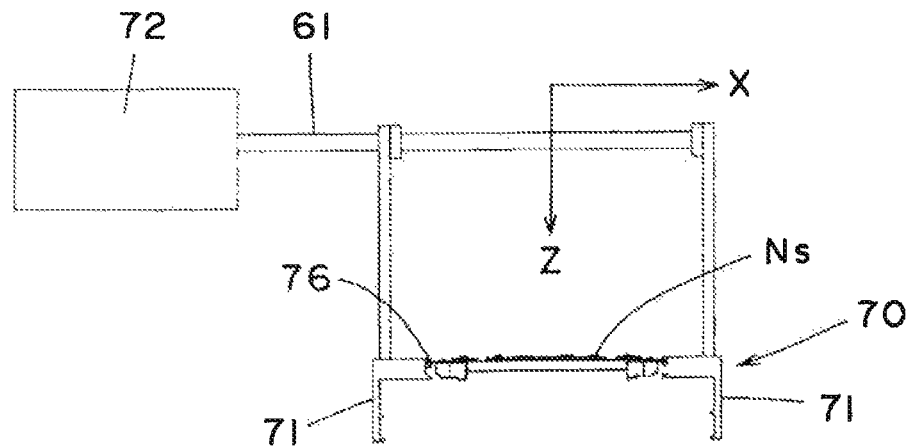
FIG. 18A is a view which shows the state of holding an inner shell of a holding mechanism in a substrate case cleaning apparatus according to an embodiment of the present invention.
Figure 18B:
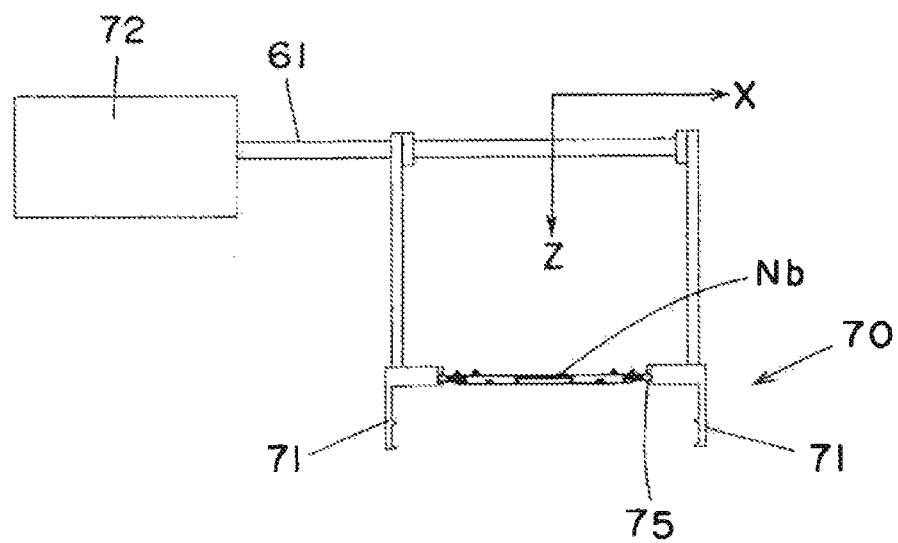
FIG. 18B is a view which shows the state of holding an inner base of a holding mechanism in a substrate case cleaning apparatus according to an embodiment of the present invention.

In this state, as shown in FIG. 1, the lids 43 and 53 of the first cleaning tank 40 and the second cleaning tank 50 are opened, the conveyance mechanism 60 is driven, and the support table 20 transfers the parts of the substrate case C to the conveyance mechanism 60. The conveyance mechanism 60 conveys the outer shell Ms, inner shell Ns, inner base Nb, and outer base Mb in that order from the support table 20 to the insides of the respectively corresponding first cleaning tank 40 and the second cleaning tank 50. The holding mechanism 61 grips the parts under the control of the control part 100 by making the holding mechanism 61 move in the two axial directions of one horizontal direction (Y-axis direction) and the vertical direction (Z-axis direction) for positioning and making the gripping hand 70 move in the other horizontal direction (X-axis direction). In this case, the pair of hand units 71, 71 of the gripping hand 70 can grip all parts. That is, the pair of hand units 71 of the gripping hand 70 are provided with lock parts 73, 74, 75, 76 which lock the outer base Mb and outer shell Ms of the outer pod M and the inner base Nb and inner shell Ns of the inner pod N corresponding to the shapes of the grip parts, so the grip on the parts becomes more reliable. FIG. 7, FIG. 10B, and FIG. 17A show the gripped state of the outer shell Ms, FIG. 11B and FIG. 17B show the gripped state of the outer base Mb, FIG. 12B and FIG. 18A show the gripped state of the inner shell Ns, and FIG. 13B and FIG. 18B snow the gripped state of the inner base Nb.

In this case, the outer shell Ms and outer base Mb are received at the first cleaning tank 40 in the following way. As shown in FIG. 10A and FIG. 10B, the control part 100 first drives rotation of the first rotating plate 44 and makes it stop at a predetermined rotation position so as to support the corner parts of the outer shell Ms by the outer shell support rods 47. In this state, the gripping hand 70 which grips the outer shell Ms descends inside the first cleaning tank 40, makes the outer shell Ms be supported by the outer shell support rods 47, then rises. In this case, the outer shell Ms is supported by the lower height outer shell support rods 47, so becomes positioned together with the gripping hand 70 lower than the higher height outer base support rods 46, but the outer base support rods 46 and the outer shell support rods 47 are placed at different positions in the rotational direction as each other, so it is possible to avoid interference with the higher height outer base support rods 46 and possible to reliably convey, support, and hold the outer shell Ms.

Next, as shown in FIG. 11A, the control part 100 drives rotation of the first rotating plate 44 and makes it stop at a predetermined rotation position so as to enable the corner parts of the outer base Mb to be supported by the outer base support rods 46. That is, the plurality of outer base support rods 46 and the plurality of outer shell support rods 47 are placed at different positions in the rotational direction as each other, that is, are offset in phase 45° in the rotation direction. The conveyance mechanism 60 can only make the holding mechanism 61 move in the two axial directions of one horizontal direction (Y-axis direction) and the vertical direction (Z-axis direction) and cannot change the orientation of the outer base Mb or the orientation of the gripping hand 70. However, it is possible to set the stop position of the outer base support rods 46 and the stop position of the support rods of the outer shell Ms different in phase and adjust the positions of the support rods with respect to the conveyance mechanism 60, so it is possible to reliably support the outer base Mb at the outer base support rods 46.

On the other hand, the inner shell Ns and inner base Nb are received at the second cleaning tank 50 in the following way. As shown in FIG. 12A and FIG. 12B, the control part 100 first drives rotation of the second rotating plate 54 and makes it stop at a predetermined rotation position so as to be able to support the corner parts of the inner shell Ns by the inner shell support rods 57. In this state, the gripping hand 70 which grips the inner shell Ns descends inside the second cleaning tank 50, makes the inner shell Ns be supported at the inner shell, support rods 57, then rises. In this case, the inner shell Ns is supported at the lower height inner shell support rods 57, so is positioned together the gripping hand 70 lower than the higher height inner base support rods 56, but the inner base support rods 56 and the inner shell support rods 57 are placed at different positions in the rotational direction as each other, so it is possible to prevent interference with the higher height inner base support rods 56 and possible to reliably convey, support, and hold the inner shell Ns.

Next, as shown in FIG. 13A, the control part 100 drives rotation of the second rotating plate 54 and makes it stop at a predetermined rotational position so as to enable the corner parts of the inner base Nb to be supported by the inner base support rods 56. That is, the plurality of inner base support rods 56 and the plurality of inner shell support rods 57 are placed at different positions in the rotational direction as each other, that is, are offset in phase 45° in the rotation direction. The conveyance mechanism 60 can make the holding mechanism 61 move in only the two axial directions of one horizontal direction (Y-axis direction) and the vertical direction (Z-axis direction) and cannot change the orientation of the inner base Nb or the orientation of the gripping hand 70. However, it is possible to make the stopping position of the support rods 56 of the inner base and the stopping position of the support rods of the inner shell Ns different in phase and possible to adjust the positions of the support rods in the conveyance mechanism 60, so the inner base Nb can be reliably supported at the inner base support rods 56.

When the conveyance mechanism 60, as shown in FIG. 14A, FIG. 14B, and FIG. 15A and FIG. 15B, finishes conveying the outer shell Ms, inner shell Ns, inner base Nb, and outer base Mb in that order from the support table 20 to the insides of the respectively corresponding first cleaning tank 40 and the second cleaning tank 50, as shown in FIG. 2, the gripping hand 70 is made to stand by at the standby position Q. Further, as shown in FIG. 1, in the first cleaning tank 40 and the second cleaning tank 50, the lids 43, 53 are closed and the parts of the outer pod M and the inner pod N are cleaned. In this case, the outer pod M and the inner pod N are cleaned by separate cleaning tanks 40, 50, so it is possible to prevent the contaminant which sticks to the outer pod M which is exposed to the outside air from causing secondary contamination of the inner pod N and therefore possible to improve the cleaning precision.

Figure 14A:
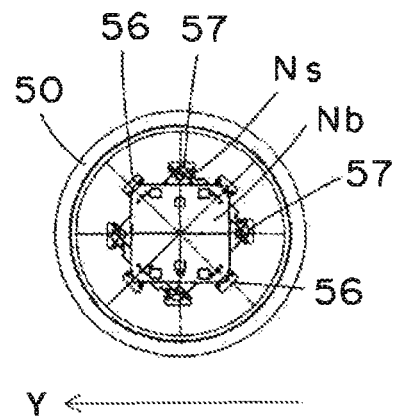
FIG. 14A is a plan view which shows the state of supporting an inner pod at a second cleaning tank in a substrate case cleaning apparatus according to an embodiment of the present invention.
Figure 14B:
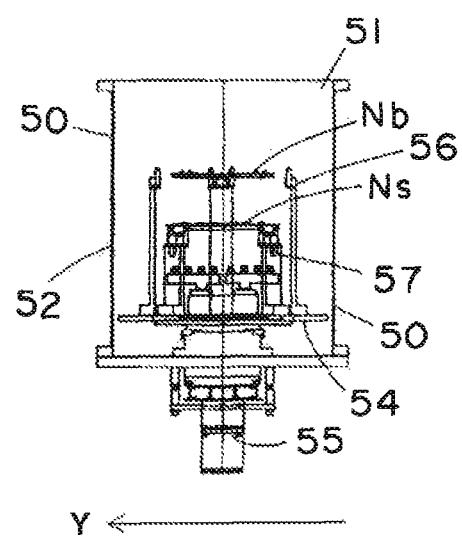
FIG. 14B is a side cross-sectional view which shows the state of supporting an inner pod at a second cleaning tank in a substrate case cleaning apparatus according to an embodiment of the present invention.
Figure 15A:
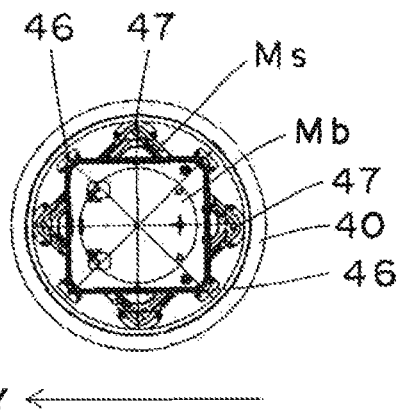
FIG. 15A is a plan view which shows the state of supporting an outer pod at a first cleaning tank in a substrate case cleaning apparatus according to an embodiment of the present invention.
Figure 15B:
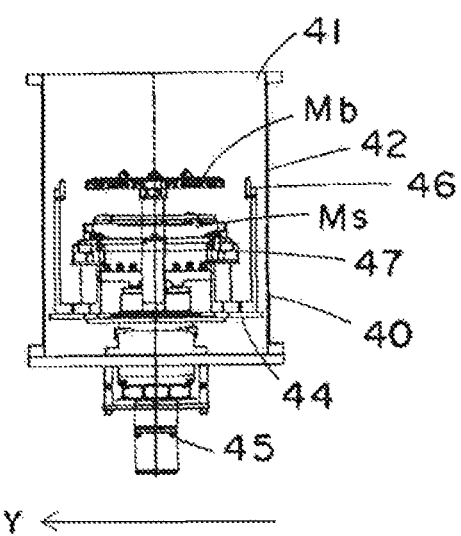
FIG. 15B is a side cross-sectional view which shows the state of supporting an outer pod at a first cleaning tank in a substrate case cleaning apparatus according to an embodiment of the present invention.

Further, as shown in FIG. 15A and FIG. 15B, in the first cleaning tank 40, the outer base support rods 46 and the outer shell support rods 47 support the parts at different predetermined height positions, so in the tank body 42, the outer base Mb and outer shell Ms are exposed at their outer surfaces and inner surfaces and are held separated from each other. For this reason, when cleaning, the cleaning solution evenly reaches the outer base Mb and the outer shell Ms and enables reliable cleaning. On the other hand, as shown in FIG. 14A and FIG. 14B, in the second cleaning tank 50 as well, the inner base support rods 56 and the inner shell support rods 57 support the parts at different predetermined height positions, so inside the tank body 52, the inner base Nb and inner shell Ns are exposed at their outer surfaces and inner surfaces and are held separated from each other. For this reason, when cleaning, the cleaning solution evenly reaches the inner base Nb and inner shell Ns and enables reliable cleaning. That is, when cleaning like in the past with one part attached to the lids 43, 53, it was hard for the cleaning solution to sufficiently reach the part attached to the lids 43, 53, in particular the surface at the lid 43, 53 side, but with the configuration of the present invention, the parts can be cleaned separated inside the tank bodies 42, 52, so it becomes possible to make the cleaning solution evenly reach the parts and reliably perform the cleaning.

In the cleaning of the parts of the outer pod M and the inner pod N, the gripping hand 70 at the standby position Q is sprayed with gas from the spray nozzle 81 of the cleaning means 80 whereby the gripping hand 70 is cleaned. The gripping hand 70 sometimes is contaminated by transfer of contaminant which sticks to the parts due to gripping of the parts, but can be cleaned by spraying gas from this spray nozzle 81. For this reason, when the gripping hand 70 grips and conveys the cleaned parts, it is possible to prevent the cleaned parts from ending up being contaminated again. Further, the gripping hand 70 is cleaned during cleaning of the parts, so it is possible to clean it each time cleaning the parts and possible to reliably prevent contamination of the parts after cleaning. Further, the spray nozzle 81 sprays gas to remove contaminant which sticks to the gripping hand 70, so it is possible to reliably remove the contaminant. Furthermore, the removed contaminant is exhausted by an exhaust fan 82 to the outside of the booth 10, so it is possible to hold the booth 10 clean at all times.

When the parts of the outer pod M and the inner pod N finish being cleaned, in accordance with a process reverse to the above, first the lids 43 and 53 of the first cleaning tank 40 and the second cleaning tank 50 are opened, then the conveyance mechanism 60 is used to convey the outer base Mb, inner base Nb, inner shell Ns, and outer shell Ms in that order from the insides of the first cleaning tank 40 and the second cleaning tank 50 to the support table 20 where they are assembled. The holding mechanism 61 grips the parts, as explained above, under the control of the control part 100 by making the holding mechanism 61 move in the two axial directions of one horizontal direction (Y-axis direction) and the vertical direction (Z-axis direction) to position it and making the gripping hand 70 move in the other horizontal direction (X-axis direction). In this case, the pair of hand units 71, 71 of the gripping hand 70 can grip all of the parts. Further, the pair of hand units 71, 71 of the gripping hand 70 are provided with lock parts 73, 74, 75, 76 which lock corresponding shapes of the grip parts of the outer base Mb and outer shell Ms of the outer pod M and the inner base Nb and inner shell Ns of the inner pod N, so the grip on the parts becomes more reliable.

In this case, the outer base Mb and outer-shell Ms are taken out from the first cleaning tank 40 in the following way. The control part 100 first, as shown in FIG. 11A, drives rotation of the first rotating plate 44 and makes it stop at a predetermined rotation position so as to enable the outer base Mb to be gripped by the gripping hand 70. In this state, the gripping hand 70 descends, grips the outer base Mb, then rises. Next, the control part 100, as shown in FIG. 10A, drives rotation of the first rotating plate 44 and makes it stop at a predetermined rotation position so as to enable the outer shell Ms to be gripped by the gripping hand 70. That is, the plurality of outer base support rods 46 and the plurality of outer shell support rods 47 are placed at different positions in the rotational direction as each other, that is, are offset in phase 45° in the rotation direction. In this state, the gripping hand 70 descends, grips the outer shell Ms, then rises. In this case, since the outer shell Ms is supported by the lower height outer shell support rods 47, it rises together with the gripping hand 70 from a position lower than the higher height outer base support rods 46, but the outer base support rods 46 and the outer shell support rods 47 are placed at different positions in the rotational direction as each other, so it is possible to prevent interference with the higher height outer base support rods 46 and possible to reliably take out the outer shell Ms.

On the other hand, the inner base Nb and inner shell Ns are taken out from the second cleaning tank 50 in the following way. The control part 100 first, as shown in FIG. 13A, drives rotation of the second rotating plate 54 and makes it stop at a predetermined rotational position so as to grip the inner base Nb by the gripping hand 70. In this state, the gripping hand 70 descends and grips the inner base Nb, then rises. Next, the control part 100, as shown in FIG. 12A, drives rotation of the second rotating plate 54 and makes it stop at a predetermined rotational position so as to grip the inner shell Ns by the gripping hand 70. That is, the plurality of inner base support rods 56 and the plurality of inner shell support rods 57 are placed at different positions in the rotational direction as each other, that is, are offset in phase 45° in the rotation direction. In this state, the gripping hand 70 descends and grips the inner shell Ns, then rises. In this case, the inner shell Ns is supported by the lower height inner shell support rods 57 and rises together with the gripping hand 70 from a lower position than the higher height inner base support rods 56, but the inner base support rods 56 and the inner shell support rods 57 are placed at different positions in the rotational direction as each other, so it is possible to avoid interference with the higher height inner base support rods 56 and possible to reliably take out the inner shell Ns.

The outer base Mb, inner base Nb, inner shell Ns, and outer shell Ms which were taken out in order from the cleaning tanks 40, 50 in this way are assembled by the reverse process on the support table 20 and supported as the substrate case C on the support table 20 (see FIG. 8E). In this state, the latch drive part 21 is driven whereby the substrate case C is locked and the parts of the outer base Mb and outer shell Ms of the outer pod M and the inner base Nb and inner shell Ns of the inner pod N are rendered undetachable. Further, the shutter 12 of the booth 10 is opened, then the advance/retraction drive part 33 of the movement mechanism 30 makes the stand 31 advance together with the support table 20 from the retraction position R2 to the advance positron R1 and transfer the substrate case C on the support table 20 to the setting table 13 (see FIG. 8D and FIG. 8C). In this case, the stand 31 is made to advance together with the support table 20 to the advance position R1, but the setting table 13 is formed in a fork shape which has an opening part 14, so the support table 20 moves through the opening of the setting table 13 while lifting up the substrate case C and is positioned at the advance position R1. At this advance position R1, the up-down drive part 34 makes the support table 20 descend and detaches the engagement projections 23 of the support table 20 from the engagement recesses 4 of the substrate case C to place the substrate case C on the setting table 13 (see FIG. 8B). In this case, the support table 20 is directly moved to make the support table 2 receive and deliver the substrate case C, so compared with the case of making it move by an arm robot like in the past, the substrate case as a whole no longer has to be gripped and transfer from the setting table 13 to the support table 20 is kept from becoming complicated and is simplified. Further, positioning at the setting table 13 also can be facilitated. Further, the support table 20 retracts to the initial position R3. In this state, the substrate case C is conveyed elsewhere from the setting table 13.

Next, the case where the outside surface of the outer base Mb does not need to be cleaned will be explained. In this case, the control part 100 is programmed in advance with the lack of need of cleaning the outside surface of the outer base Mb of the outer pod M. In the same way as the above, the parts of the outer base Mb and outer shell Ms of the outer pod M and the inner base Nb and inner shell Ns of the inner pod N which are supported at the support table 20 are conveyed by the conveyance mechanism 60. At this time, as shown in FIG. 1 and FIG. 19, the final outer base Mb is held at the holding part 90 which is provided at the back surface of the lid 43 of the first cleaning tank 40. In this case, the engagement projections 91 of the holding part 90 are engaged with the engagement recesses 4 of the outer base Mb and the outer base Mb is held by suction by the suction disks 92. For this reason, the outer base Mb is kept from moving right or left or front or back and can be reliably held at the holding part 90.

In this state, the lid 43 is closed and the cleaning is performed. In this case, the outside surface of the outer base Mb is covered, so the inside surface is reached by the cleaning solution and cleaned, but the cleaning solution is kept from penetrating to the outside surface and therefore cleaning there is not necessary. For this reason, at the outside surface of the outer base Mb, there are positioning holes and a lock part 1 which locks the assembly of parts etc. If cleaned, the cleaning solution ends up penetrating these and causing the drying to take tremendous time. If allowed to stand in a not dried state, mold will form at the inside and other detrimental effects will result in some cases, but cleaning is not performed, so these detrimental effects can be avoided.

Furthermore, in the above embodiment, the case of supporting the substrate case C on the support table 20 with the outer base Mb facing down was shown, but the invention is not necessarily limited to this. It is also possible to support the support table 20 on the substrate case C with the outer shell Ms facing down and convey the outer base Mb, inner base Nb, inner shell Ns, and outer shell Ms in that order from the support table 20 to the insides of the corresponding first cleaning tank 40 and second cleaning tank 50 before cleaning the substrate case C and convey the outer shell Ms, inner shell Ns, inner bases Nb, and outer base Mb in that order from the inside of the first cleaning tank 40 and the second cleaning tank 50 to the support table 20 for assembly after cleaning the substrata case C and possible to make other suitable changes.

Further, in the embodiment, the present invention is applied to a substrate case C of a two-layer structure which is provided with an inner pod N which is comprised of an inner base Nb and inner shell Ns and an outer pod M which is comprised of an outer base Mb and outer shell Ms, but it is not necessarily limited to this. It may also be applied to a single layer structure comprised of a base and shell like in the past and may be otherwise suitably changed.

REFERENCE SIGNS LIST

S substrate case cleaning apparatus
C substrate case
N inner pod
Nb inner base
Ns inner shell
M outer pod
Mb outer base
Ms outer shell
D substrate
1 lock part
2 insertion hole
3 positioning recess
4 engagement recess
10 booth
11 opening
12 shutter
13 setting table
14 opening part
15 positioning pin
16 positioning block
20 support table
21 latch drive part
23 engagement projection
24 section disk
30 movement mechanism
31 stand
R1 advance position
R2 retraction position
R3 initial position
32 rail
33 advance/retraction drive part
34 up-down drive part
40 first cleaning tank
41 opening
42 tank body
43 lid
44 first rotating plate
45 first rotation drive part
46 outer base support rod
47 outer shell support rod
48 support member
49 guide pin
50 second cleaning tank
51 opening
52 tank body
53 lid
54 second rotating plate
55 second rotation drive part
56 inner base support rod
57 inner shell support rod
58 support member
59 guide pin
60 conveyance mechanism
61 holding mechanism
62 elevation mechanism
63 running movement mechanism
64 base plate
65 elevator rail
66 stand
67 horizontal rail
70 gripping hand
71 hand unit
72 drive part
73, 74, 75, 76 lock parts
80 cleaning means
Q standby position
81 spray nozzle
82 exhaust fan
90 holding part
91 engagement projection
92 section disk
100 control part

The invention claimed is:

1. A substrate case cleaning apparatus which is configured to clean, in a state with no substrate, a substrate case which is provided with a base and a shell which covers said base and is configured to hold a substrate inside it, said substrate case cleaning apparatus, comprising:
a booth which forms a clean space, the booth being provided with an opening through which the substrate case can pass and is opened and closed by a shutter;
a cleaning tank which is provided inside said booth and is configured to hold and clean parts of the base and shell of the substrate case in a separated state;
a support table which supports the substrate case inside said booth;
a conveyance mechanism which is configured to convey the parts of the substrate case between said support table and said cleaning tank;
a setting table which is provided outside the opening of said booth and on which the substrate case can be positioned and placed at a predetermined position; and
a movement mechanism which is configured to open the shutter and is configured to move the substrate case placed on said setting table to said support table before cleaning the substrate case and which is configured to open the shutter and is configured to move the substrate case placed on said support table to said setting table after cleaning said substrate case, wherein said movement mechanism comprises:

a stand which is configured to carry said support table and can move to the two positions of an advance position where it is configured to advance to the setting table side and is configured to receive and deliver the substrate case between said setting table and support table and a retraction position where it retracts to the inside of said booth and delivers and receives the substrate case with said conveyance mechanism, a rail which supports said stand to be able to move, and an advance/retraction drive part which is configured to make said stand move to the two positions of the advance position and retraction position, and wherein the substrate case cleaning apparatus is configured to separate the base and shell of the substrate case, and is configured to clean the base and shell of the substrate case in a separated state.

2. The substrate case cleaning apparatus according to claim 1 wherein an engagement recess is formed at a side of the substrate case which is supported by said support table and an engagement projection which engages with the engagement recess of the substrate case is provided at said support table, said setting table is formed into a fork shape which has an opening part which opens toward the booth side and which exposes the engagement recess of the substrate case, and said support table is provided to be able to move up and down with respect to the stand of said movement mechanism, said substrate case cleaning apparatus further comprising an up-down drive part which makes said support table move up and down, and wherein at the advance position, said support table is made to rise so as to make the engagement projection of said support table engage with the engagement recess of the substrate case and raise said substrate case and can move said support table through the opening part of the setting table while lifting up said substrate case.

3. The substrate case cleaning apparatus according to claim 1 wherein the support table is provided with a suction disk which holds by suction the substrate case at a side which is supported by said support table.

4. The substrate case cleaning apparatus according to claim 1 wherein a latch type lock part which locks the parts of the substrate case to be unable to separate from each other and which unlocks them to enable separation is provided at the substrate case at the side which is supported by the support table, and a latch drive part which locks and unlocks said lock part when making said support table rise and making an engagement projection of said support table engage with an engagement recess of the substrate case at the advance position is provided at the support table.

* * * * *